US010178515B2

(12) United States Patent
Miller et al.

(10) Patent No.: US 10,178,515 B2
(45) Date of Patent: *Jan. 8, 2019

(54) AUDIO SYSTEMS AND METHODS

(71) Applicant: QUALCOMM Incorporated, San Diego, CA (US)

(72) Inventors: Brian F Miller, San Diego, CA (US); Adam E Newham, San Diego, CA (US); Jose Menendez, Encinitas, CA (US); Rohit Sauhta, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/681,643

(22) Filed: Aug. 21, 2017

(65) Prior Publication Data

US 2017/0347248 A1    Nov. 30, 2017

Related U.S. Application Data

(63) Continuation of application No. 15/159,521, filed on May 19, 2016, now Pat. No. 9,743,259, which is a
(Continued)

(51) Int. Cl.
*H04R 1/10* (2006.01)
*H04W 4/12* (2009.01)
(Continued)

(52) U.S. Cl.
CPC .............. *H04W 4/12* (2013.01); *G06F 3/017* (2013.01); *G06F 3/0482* (2013.01);
(Continued)

(58) Field of Classification Search
CPC ............. G06F 2200/1636; G06F 3/017; G06F 3/0436; G06F 3/167; G06F 1/1688; G06F 3/165
See application file for complete search history.

(56) References Cited

U.S. PATENT DOCUMENTS 7,734,692 B1    6/2010  Kaplan et al.
7,925,029 B2 *  4/2011  Hollemans ........... H04R 1/1041
                                                         381/151
(Continued)

FOREIGN PATENT DOCUMENTS

CN           1663229 A      8/2005
CN         101563941 A     10/2009
(Continued)

OTHER PUBLICATIONS

International Search Report and Written Opinion—PCT/US2013/038748—ISA/EPO—dated Jul. 11, 2013.
(Continued)

*Primary Examiner* — Duc Nguyen
*Assistant Examiner* — Kile O Blair
(74) *Attorney, Agent, or Firm* — The Marbury Law Group/Qualcomm

(57) ABSTRACT

A system for receiving multiple conversations or messages and for playing the multiple conversations or messages with a mobile device and wireless earpieces. The system may determine various presentation parameters based on various characteristics of the received messages and may play the messages such that audio appears at distinguishing locations around the user. The system may change how messages and/or conversations are played in response to recognize a change in the focus of the user based on detected user inputs, such as body movement gestures.

7 Claims, 13 Drawing Sheets

Related U.S. Application Data continuation of application No. 13/664,409, filed on Oct. 30, 2012, now Pat. No. 9,374,448.

(60) Provisional application No. 61/652,228, filed on May 27, 2012.

(51) Int. Cl.

| | |
|---|---|
| *H04M 3/56* | (2006.01) |
| *H04M 1/60* | (2006.01) |
| *H04M 1/725* | (2006.01) |
| *G06F 3/01* | (2006.01) |
| *G06F 3/0482* | (2013.01) |
| *G06F 3/0484* | (2013.01) |
| *G06F 3/0488* | (2013.01) |
| *H03G 3/02* | (2006.01) |
| *H04B 1/3827* | (2015.01) |
| *H04M 1/05* | (2006.01) |
| *H04R 1/08* | (2006.01) |
| *H04R 3/00* | (2006.01) |
| *H04M 3/436* | (2006.01) |

(52) U.S. Cl.
CPC ...... *G06F 3/04842* (2013.01); *G06F 3/04883* (2013.01); *H03G 3/02* (2013.01); *H04B 1/385* (2013.01); *H04M 1/05* (2013.01); *H04M 1/6041* (2013.01); *H04M 1/6066* (2013.01); *H04M 1/7255* (2013.01); *H04M 1/72519* (2013.01); *H04M 3/568* (2013.01); *H04R 1/08* (2013.01); *H04R 1/1041* (2013.01); *H04R 3/00* (2013.01); *H04B 2001/3872* (2013.01); *H04M 3/436* (2013.01); *H04M 2250/02* (2013.01); *H04M 2250/12* (2013.01); *H04M 2250/62* (2013.01); *H04R 2420/07* (2013.01); *H04R 2460/15* (2013.01)

(56) References Cited

U.S. PATENT DOCUMENTS

| | | | |
|---|---|---|---|
| 7,966,084 B2* | 6/2011 | Bengtsson | G06F 1/1626 340/540 |
| 7,996,496 B2 | 8/2011 | Haartsen et al. | |
| 7,996,571 B2 | 8/2011 | Salokannel | |
| 8,605,863 B1 | 12/2013 | Sauriol et al. | |
| 8,634,565 B2* | 1/2014 | Asada | G06F 1/1626 381/122 |
| 9,081,419 B2 | 7/2015 | Tocino Diaz et al. | |
| 9,374,448 B2 | 6/2016 | Miller et al. | |
| 2001/0014161 A1 | 8/2001 | Baiker et al. | |
| 2005/0053221 A1 | 3/2005 | Reding et al. | |
| 2005/0135333 A1 | 6/2005 | Rojas | |
| 2005/0136896 A1 | 6/2005 | Ward et al. | |
| 2006/0045304 A1* | 3/2006 | Lee | H04R 1/1041 381/384 |
| 2006/0205426 A1 | 9/2006 | Denton | |
| 2008/0095338 A1 | 4/2008 | Cosky | |
| 2008/0144794 A1 | 6/2008 | Gardner | |
| 2009/0010403 A1 | 1/2009 | Jorgensen et al. | |
| 2009/0034704 A1 | 2/2009 | Ashbrook et al. | |
| 2009/0074169 A1 | 3/2009 | Mohan | |
| 2009/0238386 A1 | 9/2009 | Usher et al. | |
| 2009/0318085 A1 | 12/2009 | Seshadri et al. | |
| 2010/0040239 A1* | 2/2010 | Fretz | H04R 25/453 381/60 |
| 2010/0137015 A1 | 6/2010 | Blanco | |
| 2010/0172522 A1* | 7/2010 | Mooring | H04R 1/1041 381/311 |
| 2010/0202626 A1* | 8/2010 | Shiori | H04R 1/1091 381/74 |
| 2010/0240345 A1 | 9/2010 | Karrman et al. | |
| 2011/0012743 A1 | 1/2011 | Van Gorp et al. | |
| 2011/0059769 A1 | 3/2011 | Brunolli | |
| 2011/0310213 A1 | 12/2011 | Garcia | |
| 2012/0044062 A1 | 2/2012 | Jersa et al. | |
| 2012/0046768 A1 | 2/2012 | Raoufi | |
| 2013/0091262 A1 | 4/2013 | Rajakarunanayake et al. | |
| 2016/0269878 A1 | 9/2016 | Miller et al. | |

FOREIGN PATENT DOCUMENTS

| | | |
|---|---|---|
| CN | 101938625 A | 1/2011 |
| WO | 03022001 A1 | 3/2003 |
| WO | 2010149166 A1 | 12/2010 |

OTHER PUBLICATIONS

Partial International Search Report—PCT/US2013/038748—ISA/EPO—dated Jul. 16, 2013.
Surana A., et al., "Introducing IBM SmartCloud Meetings", Oct. 13, 2009 (Oct. 13, 2009), XP055086122, Retrieved from the Internet: URL:http://www.ibm.com/developerworks/lotus/library/lotuslive-meetings/.

\* cited by examiner

AUDIO SYSTEMS AND METHODS

RELATED APPLICATIONS

This application is a continuation of Ser. No. 15/159,521 entitled "Audio Systems and Methods" filed May 19, 2016, which is a continuation of U.S. application Ser. No. 13/664,409 entitled "System and Methods for Managing Concurrent Audio Messages" filed Oct. 30, 2012, now U.S. Pat. No. 9,374,448, which claims the benefit of priority of U.S. Provisional Application 61/652,228 entitled "Multi-Person Whisper Service" filed May 27, 2012, the entire contents of which are incorporated herein by reference.

BACKGROUND

Mobile devices, such as mobile phones, smart phones, tablets, or laptops, may have various types of personal communication systems for managing or responding to communications and/or messages such as phone calls or text messages received at the same time. Such personal communication systems include call waiting, sending a second caller to voicemail, or simply ignoring the second caller. For example, if a smart phone receives a phone call when the user is currently operating it, the smart phone may prompt the user to choose among answering the call or sending the second caller to voicemail while the user remains talking to the first caller. This method manages the two calls received at the same time, but does so awkwardly for all parties involved.

Concurrent communications, particularly voice calls received at the same time, may be more inconvenient or difficult to manage for many mobile device users. For example, users employing phone conference calling techniques may lose track of the identities of the various participants as anyone may speak at any time. Additionally, orchestrating the start of a multi-party conversation or handling concurrent discussions may be difficult with many technical inconveniences. For example, when a mobile user encounters concurrent calls (e.g., a second call via call waiting), the user may be forced to engage in cumbersome button presses, numerous smart phone menu operations, or directing a caller to voicemail.

SUMMARY

The communication systems, methods, and devices of the various embodiments enable a wireless connection of communication devices to manage and respond to concurrent or colliding messages and/or conversations in a way that enables a user to effectively manage two conversations at one time, much like talking to two people in the hallway.

In an embodiment, a user may employ a personal communication system including a mobile device coupled to two wireless earpieces (e.g., one for each of the left and right ears) to conduct multiple audio communications and blend two or more concurrent audio streams by altering their presentation. The mobile device may present multiple concurrent audio messages (e.g., whisper service audio files, which are audio clips that may be played on wireless earpieces when received by a mobile device) and/or voice conversations in a manner that enables a user to distinguish the two or more messages and/or conversations. For example, the mobile device may use three-dimensional (3D) sound effects so that messages/conversations are perceived by a user to be positioned separately in space around the user. For example, one message/conversation may be perceived to come from in front of the user, another message/conversation may be perceived to come from behind the user, a third message/conversation may be perceived to come from the left side of the user, and a fourth message/conversation may be perceived to come from the right side of the user. The audible presentation may include other effects, such as presenting one or more messages/conversations louder than others, generating or modifying sound so that one or more messages/conversations appears to be near the user while other messages/conversations sound distant, presenting one message/conversation in one ear and another message/conversation in the other ear, and muffling one or more messages/conversations while others are played so they are clear. This audible presentation of multiple audible messages and/or conversations may be configured so they mimic real life conversation situations, such as when the user is speaking in the hall with one person and hears another person call from afar.

In the various embodiments, a mobile device may direct audio messages to one or both wireless earpieces, adjust the presentation characteristics of the audio messages, and send messages to sender computing devices in response to detecting colliding messages or voice calls. The mobile device may use configuration files (e.g., user preferences), contact lists (e.g., a list of known and/or privileged contacts), and/or timing of received messages/conversations to determine the manner of playing the audio streams. The mobile device may also change focus between active messages and/or conversations in response to detecting user gestures, movements, or interactions with the mobile device, earpieces, and/or other connected devices. In another embodiment, the mobile device may admit new conversation participants to an ongoing conversation based on proximity, gesture inputs, or inputs from user interactions with the mobile device or wireless earpieces.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION

Figure 1:
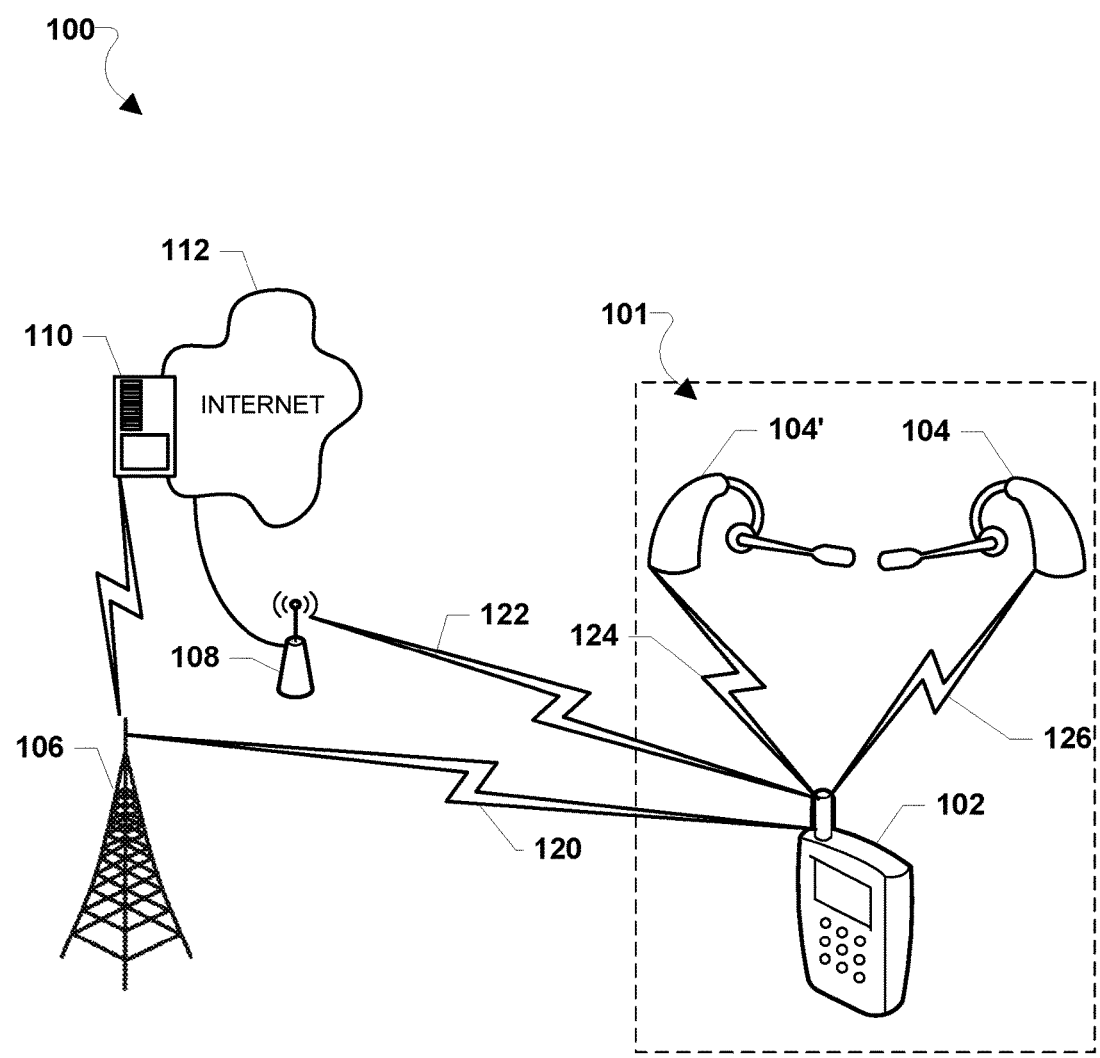
FIG. 1 is a communication system block diagram of a network suitable for use with the various embodiments.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The word "exemplary" or "for example" is used herein to mean "serving as an example, instance, or illustration." Any implementation described herein as "exemplary" or "for example" is not necessarily to be construed as preferred or advantageous over other implementations.

As used herein, the terms "mobile device" and "receiver device" are used interchangeably herein to refer to any one or all of cellular telephones, smart phones, personal or mobile multi-media players, personal data assistants (PDA's), laptop computers, tablet computers, smart books, palm-top computers, wireless electronic mail receivers, multimedia Internet enabled cellular telephones, wireless gaming controllers, and similar personal electronic devices that include a programmable processor and memory and circuitry for sending and/or receiving voice and data calls, sending and/or receiving messages (e.g., short message service (SMS) messages, e-mails, application notifications, such as Facebook® post notifications and/or game high score change notifications, etc), sending and/or receiving warnings (e.g., low battery warnings, loss of network connectivity warnings, etc), and/or sending and/or receiving reminders (e.g., calendar reminders, task reminders, etc).

As used herein, the terms "user," "sender," "recipient," and "participant" refer to a person sending and/or receiving a message using a computing device, such as a mobile device or any other device capable of transmitting SMS text messages, emails, whisper messages, audio data, or any other such electronic communications. Senders, recipients, users, and participants may also employ a personal communication system with a mobile device and wireless earpieces when sending and/or receiving messages.

The various embodiments may be utilized with a personal communication system that includes a mobile device coupled to two wireless earpieces configured to be comfortably worn without disrupting a user's normal hearing. Since the wireless earpieces may be comfortably worn, the personal communication system may be utilized by a user throughout the day. Since the personal communication system, in particular the two wireless earpieces coupled to the mobile device, may be worn and active all day, a new communication service may be offered whereby selected individuals (e.g., those individuals on a user-defined privilege list) may communicate by sending audio clips that are immediately played in the user's ears like a whisper. For purposes of this application, the term "whisper message" refers to an audio clip message that may be delivered to a mobile computing device and promptly played on wireless earpieces. Such a whisper message may be in addition to SMS, MMS and email messages, although such text-based messages may be converted into audio streams through speech synthesis. Thus, in an embodiment of a personal communication system, conventional text-based messages may be played in the user's ear in the same manner as whisper messages if the user so chooses.

In the whisper message service, a sender wishing to send a whisper message may speak a brief verbal message into their mobile device or computer (which may be running an application for creating whisper messages such as YagattaTalk®), and then press a send key or icon. The audio clip data may be transmitted through a wireless network (e.g., either a cellular data network or a WiFi network depending upon current connectivity) and delivered to the intended recipient's mobile computing device. To the sender, the service may operate very much like push-to-talk communications, but the message may be handled more like SMS messages. Upon receiving a whisper message, the recipient's mobile computing device may determine whether the sender is on a privilege list, and if so, immediately play the audio clip through one or both of the ear pieces. In this manner, privileged senders can deliver a personal audio message to recipients with the message being played immediately (or in response to a user action) in the recipient's ear just like a private whisper. If the sender is not on the user's privilege list, the user may elect (e.g., through a user setting or operating mode) to store the whisper message in memory to be played when the user elects.

In an embodiment, a user may direct his or her personal communication system to record a whisper message and store the whisper message to represent the user's current status. Another user, using a similar personal communication system that can handle whisper messages, may then request to listen to the first user's whisper message status. In a similar fashion, any user with the whisper message service could choose to listen to the current status of other users via a list of his or her preprogrammed contacts. For example, this would be analogous to a person updating their text-based Facebook® status, or a person reading their Facebook® newsfeed of all status updates of a person's designated friends. However, through the whisper service, audio clips would be recorded instead of typed, and other users could choose to listen to their contacts current status instead of reading them. This embodiment is useful because it would allow a user to determine a contact's status (e.g., busy, available or other detailed information such as out of the country) and provide the user with relevant feedback prior to sending a directed whisper message, phone call, SMS, or other form of communication to the contact.

In an embodiment, the personal communication system may enable one-way voice conversations. For example, a professor may conduct a whisper voice conversation with a class of students in which the professor is exclusively allowed to contribute to the conversation. The personal communication system may detect alert messages from parties who desire to contribute to the conversation, analogous to a student raising her hand to speak. Based on the user's input via personal communication system interactions (e.g., graphical user interface buttons, speech commands, or recognized gestures), the personal communication system may temporarily provide permission to the other parties to enable them to contribute to the voice conversation. Permissions may be granted on a case-by-case basis or through an open response period. For example, the professor may allow contributions from students when they transmit speaking requests and/or during a pause in the professor's speech (e.g., when the sound input to the professor's microphone goes low for a period of time exceeding a threshold).

In another embodiment, the personal communication system may create group voice conversations between the user and other individuals, including parties located near the user and remote participants. For example, the user employing a personal communication system may exchange whisper messages (e.g., audio memos) with a remote participant, meet another person in the hallway, and begin transmitting whisper messages to both individuals. The personal communication system may detect potential participants of a multi-person conversation by using radio signals to determine whether whisper-capable devices are within a predetermined range (e.g., with the communication range of a short-range radio). In response to a user's input, the personal communication system may include the new participants into the whisper voice conversation.

While the whisper service has many communication benefits for users, immediately playing whisper messages when they are received can result in confusion if the user is already listening to another message or engaged in another communication (e.g., a voice call). To address this problem, the various embodiments provide systems and methods for rendering/playing multiple concurrent audio messages within a personal communication system consistent with the user's priorities and focus of attention.

Received messages and/or conversations that overlap may be handled by the personal communication system may include voice calls, whisper messages, text based messages processed through a voice synthesizer, social media messages, and application reminders. The embodiments may also enable handling collisions that occur between audio messages and/or conversations, such as podcasts, radio programs, music files, etc. Examples of colliding audio streams include whisper messages received concurrently from multiple senders, overlapping whisper messages such as whisper messages received while the user is on a voice call, and two concurrent phone calls at the same time.

In the various embodiments, the personal communication systems may receive static messages (e.g., pre-recorded audio, text, email), two-way active conversations (e.g., real-time phone conversation), and one-way active conversations (e.g., a sender may speak and the user may listen). For example, a sender may transmit a static whisper memo message to the user. In an embodiment, the personal communication system may establish open communication channels capable of sporadic and random transmissions. For example, a sender and the user may exchange persistent, live audio feeds (e.g., an open microphone stream) throughout a period of time. As another example, if the sender and the user are exchanging whisper service messages, the effect will be very similar to a conversation in a telephone call, even though there is no live connection established between the parties' respective computing devices.

The embodiment personal communication systems may receive and process messages from senders that have a privileged status as defined by the user of the personal communication system. The senders of messages received by the personal communication system may be included within a user-designated privileged list maintained and stored within the memory of the mobile device. The personal communication system may authorize, authenticate or otherwise approve the senders to allow whisper messages from the senders to be received by the personal communication system and played as described below.

In the various embodiments, the personal communication system may distinguish and/or rank the concurrent messages and/or conversations in various ways based on the characteristics of the messages. For example, the personal communication system may evaluate metadata encoded within the messages, the order of arrival, message priority or urgency indications, characteristics of the senders/callers including whether the sender is a privileged contact, and other factors to determine message/conversation relative rankings.

Based on the determined message/conversation relative rankings and/or other evaluations, the personal communication system may select various presentation parameters for playing the messages and/or conversations. Presentation parameters may define the volume, the audio quality, the speed, applied filtering effects, and other attributes that the personal communication system may use to play the messages and/or conversations in a manner that enables the user to distinguish among the concurrent messages and/or conversations. In an embodiment, the personal communication system may also utilize three-dimensional audio techniques to provide the perception of depth to the presentation of multiple messages and/or conversations.

In an embodiment, the personal communication system may detect the user's input that define or reflect the focus of the user and adjusts the presentation of multiple messages accordingly. The user's focus may be processed as a personal communication system variable that the personal communication system updates as the personal communication system receives a user's input in the form of interactions with the personal communication system devices (e.g., the mobile device and wireless earpieces) and/or recognizes user body movements or gestures based on data from motion sensors on personal communication system components. For example, the personal communication system may determine where the user is looking or recognize certain body movement gestures by evaluating data from motion sensors within the wireless earpieces. For example, the wireless earpieces may include a suite (or sensor pack) of accelerometers, magnetometers, and in/or gyroscopes configured to generate sensor data that can be used by the personal communication system to estimate lateral and rotational movements of the user's head about the normal six degrees of freedom (i.e., 6-axis). The personal communication system may maintain a database of recognized gestures in the form of patterns of motion sensor data that the personal communication system may use to determine the user's direction of focus and/or recognize personal communication system commands. When the personal communication system detects patterns in motion sensor data the personal communication system may change the focus variable consistent with the user's focus of attention, and change the manner in which the multiple audio streams are played accordingly.

FIG. 1 illustrates a wireless network system 100 suitable for use with the various embodiments. The wireless network system 100 includes a personal communication system 101 that may include multiple communication devices, such as a mobile device 102 wirelessly coupled to a right wireless earpiece 104' and a left wireless earpiece 104. The mobile device 102 and the wireless earpieces 104' and 104 may exchange data via a wireless data links 124 and 126. As an example, the wireless data links 124 and 126 between the mobile device 102 and the wireless earpieces may be a Bluetooth® connection.

Additionally, the mobile device 102 may be configured to connect to the Internet 112 via wireless connections 120 and 122, respectively, established with a wireless access point 108, such as a Wi-Fi access point. The wireless access point 108 may connect with the Internet 112. In this manner data may be exchanged between the mobile device 102 and other Internet 112 connected devices by methods well known in the art. Additionally, the mobile device 102 and a cellular tower or base station 106 may exchange data via a cellular connection 120, including CDMA, TDMA, GSM, PCS, G-3, G-4, LTE, or any other type connection. The cellular tower or base station 106 may be in communication with a router 110 that may connect to the Internet 112. In this manner, data (e.g., voice calls, text messages, e-mails, etc.) may be exchanged between the mobile device 102 and other devices by methods well known in the art.

Figure 2:
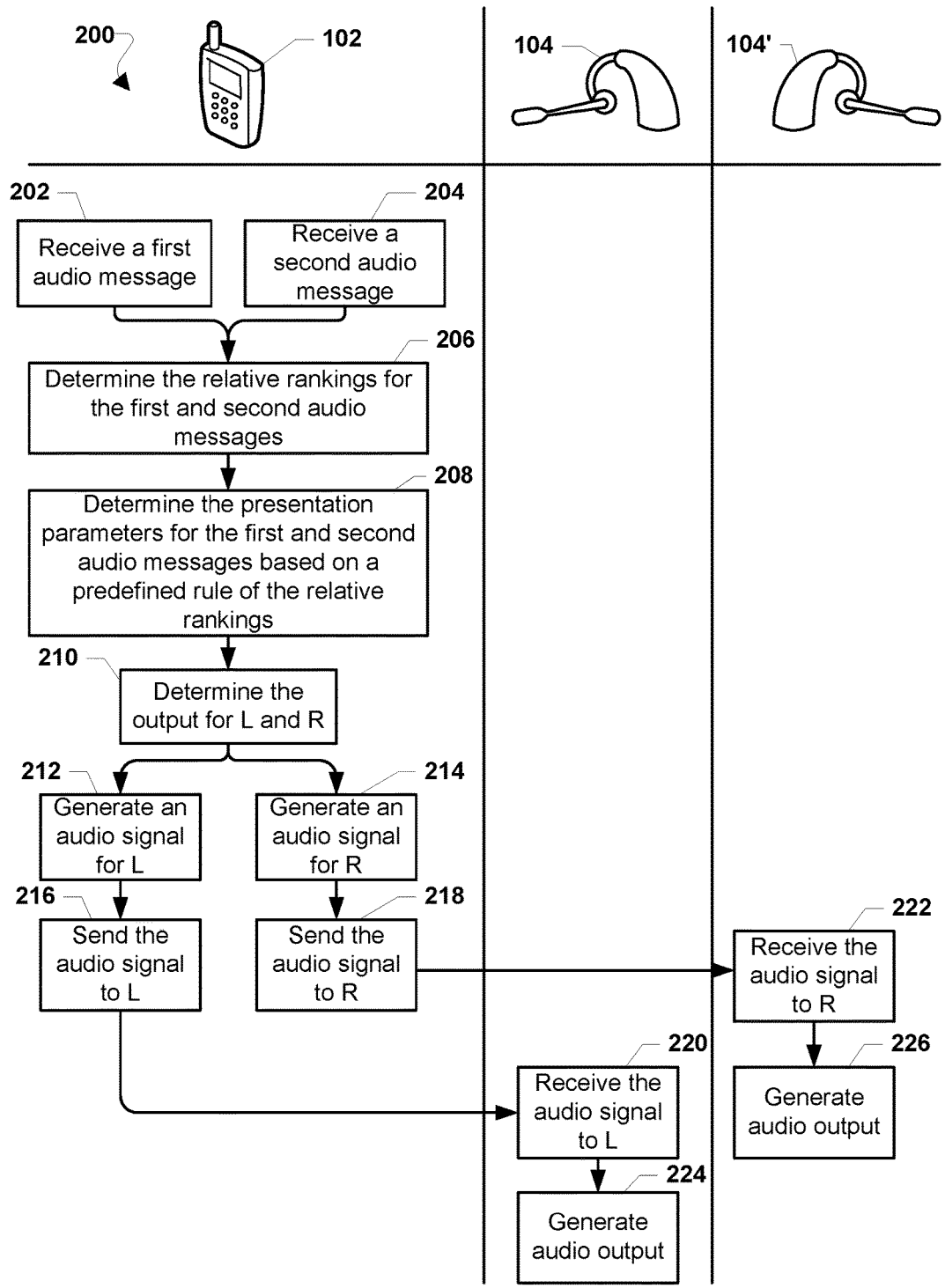
FIG. 2 is a process flow diagram illustrating an embodiment method for determining the audio output of two or more concurrent incoming audio messages to wired or wireless earpieces.

FIG. 2 illustrates an embodiment method 200 for managing the audio output from wireless earpieces 104 and 104' of two or more overlapping audio messages on the mobile device 102. In block 202 the mobile device 102 may receive a first audio message and in block 204 the mobile device 102 may also receive a second audio message at the same time. As an example, the audio messages received at blocks 202, 204 may form part of a voice and/or data call that may be established over a cellular network or a Wi-Fi connection to the Internet 112. In block 206, the mobile device 102 may determine the relative rankings for the first and second audio messages.

A variety of different approaches may be used for determining relative rankings to overlapping audio messages. To implement a predefined rule-based method for assigning relative rankings to overlapping messages/conversations, the mobile device 102 may maintain a protocol file that includes rules that the mobile device 102 can apply to the messages in order to determine their relative rankings. Such rules may be selected or applied based on information included within the audio messages (e.g., metadata, sender or caller ID, priority indications, etc.), as well as information stored within the mobile device, such as a privileged contact database. In another rule-based approach, ranking of messages may be determined by the type of message due to the relative importance of different types of communication. For example, a phone call and a Push-to-Talk (PTT) audio may take priority over a whisper message, voicemail, SMS, and e-mail because a phone call and PTT audio is generally more urgent than the latter forms of communication. Likewise, a whisper message may take priority over an SMS. In another approach, the personal communication system 101 may present a user with prompts to provide inputs to the personal communication system 101 so that the personal communication system 101 can use to determine relative rankings for colliding audio messages. In this approach, the user may be prompted pick a particular message to hear first, or to "break a tie" when other approaches are unable to determine the relative priority for the colliding audio messages. For example, the mobile device 102 may display a graphical user interface ("GUI") button that the user may tap to indicate the relative rankings for concurrently received audio messages.

In block 208, the mobile device 102 may determine the presentation parameters for the first and second audio messages based on a predefined rule of the relative rankings determined in block 206. For example, the mobile device 102 may access a protocol file for determining the presentation parameters for the first and second audio messages based on a predefined rule of the relative ranking of the first and second audio messages. In block 210, the mobile device 102 may determine the output to be played in the left wireless earpiece 104 and the right wireless earpiece 104'. In block 212, the mobile device 102 may generate an audio signal for the left wireless earpiece 104, and send that signal to the left wireless earpiece 104 via the wireless link in block 216. In block 220, the left wireless earpiece 104 may receive the audio signal from the mobile device 102 and may, in block 224, generate audio output, e.g., by playing the audio via one or more speakers in the earpiece 104. Similarly, in block 214, the mobile device 102 may generate an audio signal for the right wireless earpiece 104', and send that signal to the right wireless earpiece 104' via the wireless link in block 218. In block 222, the right wireless earpiece 104 may receive the audio signal from the mobile device 102 and may, in block 226, generate audio output, e.g., by playing the audio via one or more speakers in the earpiece 104'.

Figure 3:
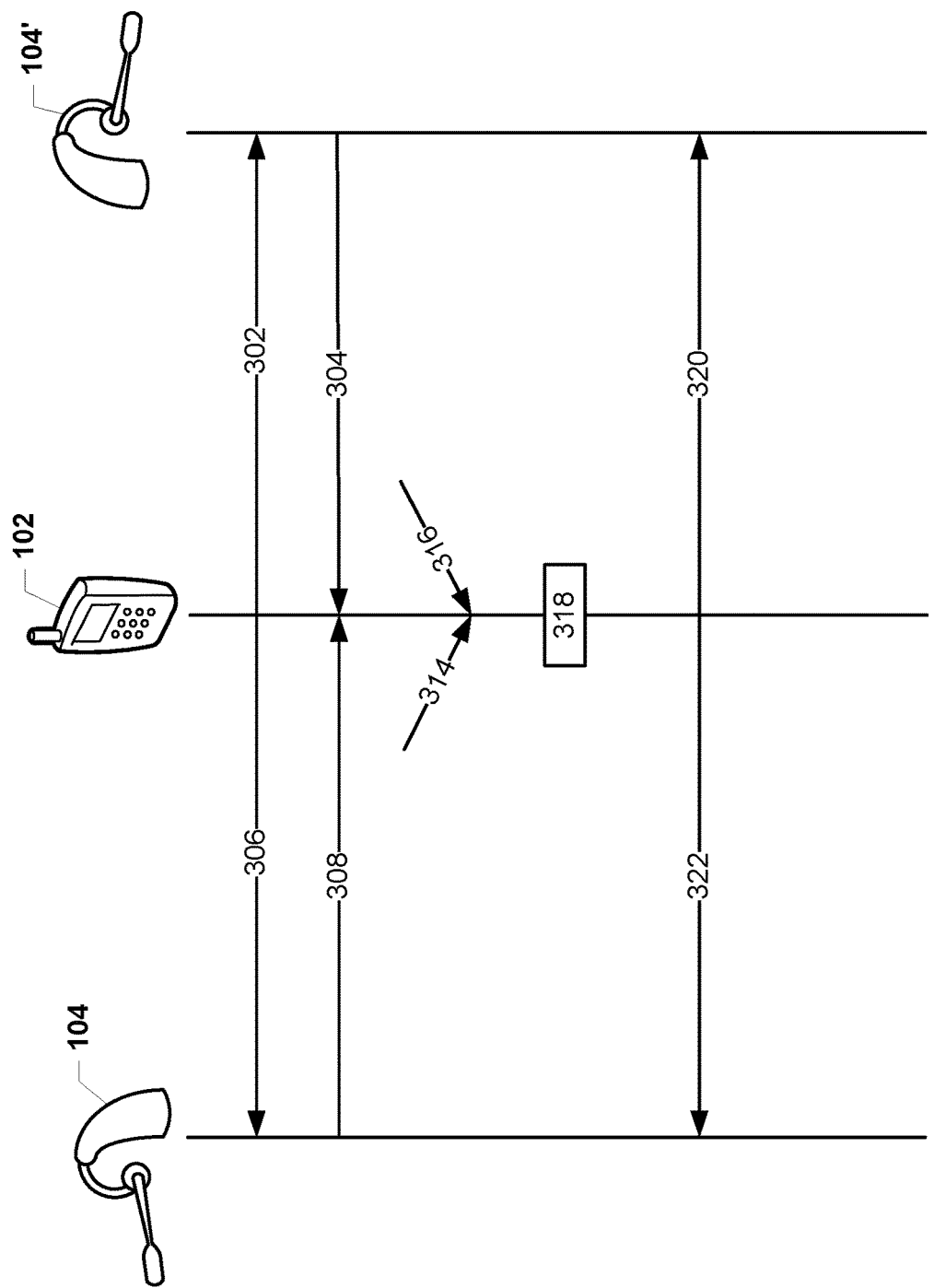
FIG. 3 is a communications flow diagram illustrating example interactions between a mobile device, a left wireless earpiece, and a right wireless earpiece.

FIG. 3 is a communication flow diagram illustrating example interactions between the mobile device 102 and wireless earpieces 104, 104' occurring when the mobile device receives an incoming audio message. As part of an initialization routine the mobile device 102 may send a pairing request message 302 to the right wireless earpiece 104'. In response the mobile device 102 may receive a pairing response message 304 from the right wireless earpiece 104'. In this manner, the mobile device 102 and the right wireless earpiece 104' may be paired and establish a wireless data link with each other, such as wireless data link 124.

In a similar manner, the mobile device 102 may send a pairing request message 306 to the left wireless earpiece 104. In response, the mobile device 102 may receive a pairing response message 308 from the left wireless earpiece 104. In this manner, the mobile device 102 and the left wireless earpiece 104 may be paired and establish a wireless data link with each other, such as wireless data link 126.

When the mobile device 102 receives a first audio message 314, and a second audio message 316 at the same time, the mobile device 102 may determine the relative rankings of the two audio messages, and based on the determined relative rankings determine the presentation parameters that may be applied to each audio message 318. In an embodiment, the mobile device 102 may play the first and second audio messages on one or both of the ear pieces 104, 104'. The mobile device 102 may generate different audio outputs for each of the right and left wireless earpieces 104, 104'. In this manner, different audio may be presented in each of the user's right and left ears. By applying different audio effects to the sounds produced in the right and left earpieces, the personal communication system 101 is able to present multiple audio messages/conversations to a user in a manner that enables the user to distinguish the various sounds, much like how individuals are able to process sounds received from different directions in ordinary circumstances.

FIGS. 4-9 illustrate various embodiment methods for handling concurrent messages received by the personal communication system 101 that includes at least a mobile device and one or both wireless earpieces.

Figure 4:
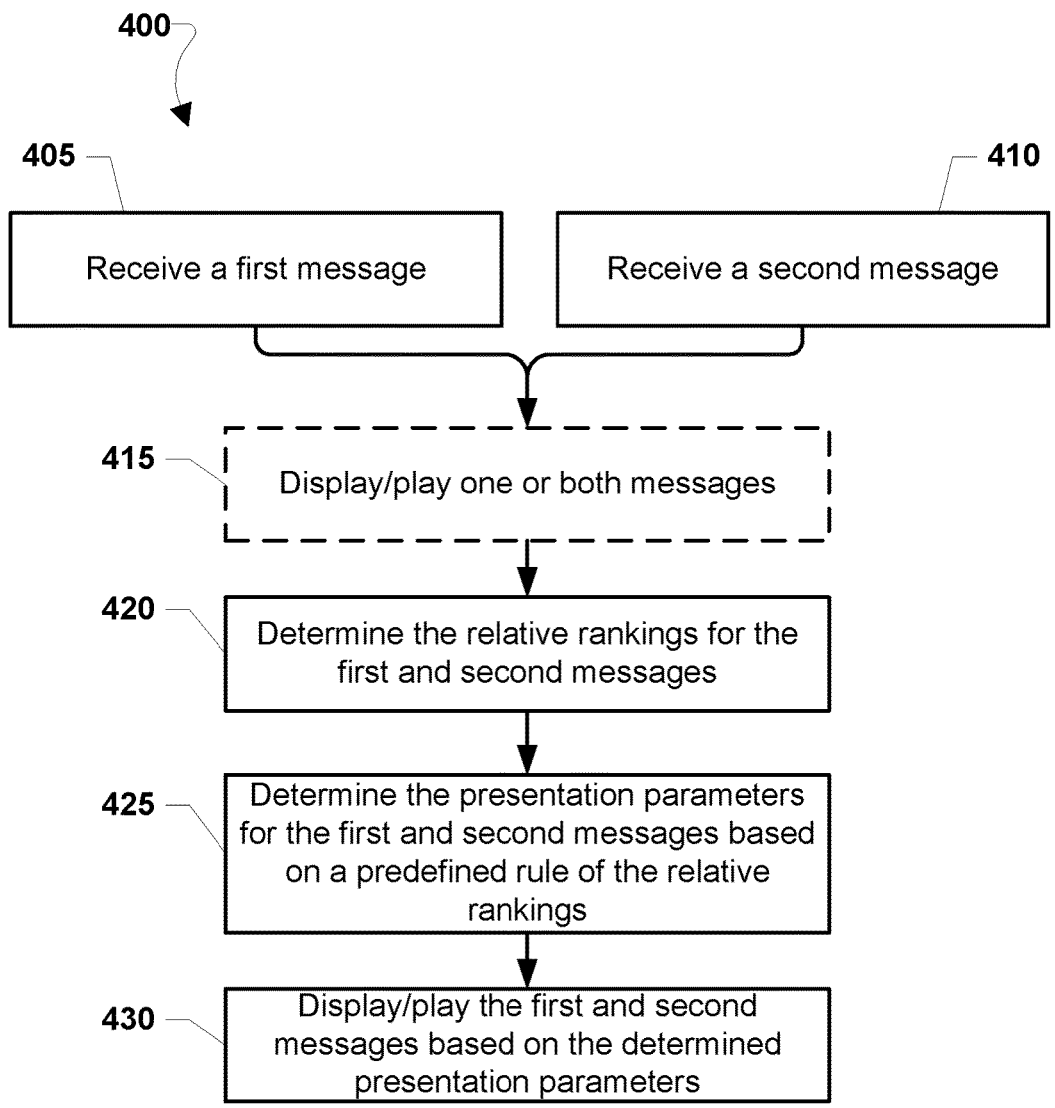
FIG. 4 is a process flow diagram illustrating embodiment methods for receiving, organizing, and presenting multiple messages and/or conversations.

FIG. 4 illustrates an embodiment method 400 for handling two messages that are received by the personal communication system 101 (e.g., the mobile device 102, one or both wireless earpieces 104, 104' and/or other components) at the same time. The personal communication system 101 may receive a first message in block 405, and a second message in block 410. For example, the personal communication system 101 may receive two whisper messages or similar type of audio memos through a cellular network. In optional block 415, the personal communication system 101 may display/play one or both messages. One or both of the received messages may be displayed on the mobile device 102 or may be played on one or both of the wireless earpieces 104, 104'. For example, while a whisper message is played through the one or both wireless earpieces 104, 104', at the user's discretion, the whisper message may also be converted to text via a speech-to-text software routine and displayed for the user to read on the mobile device 102. In an alternate example, a text message may be the received message, which may be converted to audio via a text-to-speech software routine and played concurrently with another message on the personal communication system 101 (e.g., on one or both of the wireless earpieces 104, 104'). In an alternate example, the whisper message or messages may be played though another speaker of any other personal communication system 101 component (e.g., on a speaker of the mobile device 102).

In block 420, the personal communication system 101 (e.g., the mobile device 102, the earpieces 104, 104' and/or other components) may determine the relative rankings for the first and second messages. The relative rankings may be used by the personal communication system 101 to determine how to play or display both messages. As discussed above, the personal communication system 101 may evaluate ranking based on the type of message. For example, the personal communication system 101 may rank the first message as having a higher relative ranking because it is a phone call, while the second message may be given a lower relative rank because it is a text message that was converted to audio. As another example, the system 101 may give a higher relative rank to a text-to-audio e-mail flagged as urgent, while giving a lower relative rank to a whisper message.

In an embodiment, the personal communication system 101 may rank the messages based on the identities of the senders. For example, if the first message sender is a family member and the second message sender is a work colleague, the personal communication system 101 may rank the first message sender as higher. The personal communication system 101 may also determine the relative ranking of the messages and/or conversations based on information within a privileged list. For example, the personal communication system 101 may store a contact or address book database that contains a relative ranking for each contact. Alternatively, the personal communication system 101 may process the message contents to determine the relative rankings based on message subject matter, topicality, or relevancy evaluations. For example, the personal communication system 101 may execute a language processing routine to interpret text or audio contents and determine the topic of the message.

In an embodiment, the personal communication system 101 may evaluate metadata within the messages and/or conversations to determine the relative rankings. For example, the personal communication system 101 may parse the first and second messages to decode metadata within each that describes the importance of the content of the respective messages. The personal communication system 101 may also determine other message characteristics, such as the sender identity, the type of message, and recommended presentation parameters, based on metadata. For example, a received message may contain embedded metadata instructing the personal communication system 101 to apply a language translation routine to the included audio/text message content.

In an embodiment, the personal communication system 101 may modify the audio output of one or all of colliding messages and/or conversations based upon a determination of the user's focus of attention. The user's focus of attention may be determined based upon the user's inputs, body positions (e.g., a direction in which the user's is facing) and other information available to the personal communication system 101. This capability enables the personal communication system 101 to respond to the user's own focus of attention, so that those messages of most interest to the user are presented in the most appropriate manner, while other messages may be deemphasized, reduced in volume, muffled, positioned behind or removed from the user, or otherwise modified as described herein. Upon determining the user's focus of attention with respect to the current messages and/or conversations, the personal communication system 101 may assign a value to a focus variable that may also be used as part of determining the relative rankings of the colliding messages/conversations. Thus, a message or conversation that is the focus of the user's attention may be assigned the highest relative ranking and presented to the user through the earpieces consistent with that high ranking, while other messages/conversations are deemphasized. Embodiments of methods for determining the focus variable are discussed below with reference to FIG. 5.

In an embodiment, the personal communication system 101 may record and track determined relative rankings for each received message. For example, the personal communication system 101 may record the relative ranking for each whisper message received within a certain period of time. The personal communication system 101 may re-evaluate the relative rankings of messages in response to detecting changes in conditions, the user's focus of attention, and/or information contained within the messages. For example, the relative rankings for all tracked or active messages and/or conversations may be re-evaluated each time a new message is received or dispatched by the personal communication system 101.

In another embodiment, the personal communication system 101 may randomly determine the relative rankings of concurrent messages. For example, the personal communication system 101 may determine relative rankings using a pseudorandom selection method so that the user does not appear to have a bias that may be detected by others.

In block 425, the personal communication system 101 may determine the presentation parameters for the first and second messages based on a predefined rule of the relative rankings. For example, the personal communication system 101 may access a protocol file for determining the presentation parameters for the first and second messages based on a predefined rule. The protocol file may contain rule-based instructions describing how messages of various relative rankings may be presented by the personal communication system 101. For example, the protocol file may include rules to play a message having a higher-relative ranking before playing a lower-relative ranking message. In an embodiment, the protocol file may represent predefined default configurations and/or preferences defined by the user of the personal communication system 101. For example, the user may indicate within a preference list that the personal communication system 101 should always display/play messages received from a certain sender using particular presentation techniques.

The protocol file may define presentation parameters for modifying and playing messages of a particular relative ranking The presentation parameters may include identification of devices that may play an audio message, the volume of message audio, effects to apply to audio messages, and particular software to execute when processing and/or playing the message. For example, the protocol file may include rules that messages and/or conversations containing audio data may be played through the wireless earpieces. As another example, the protocol file may indicate that higher relative ranking audio files are to be played at a higher volume than lower relative ranking audio files. As another example, the protocol file may indicate that higher relative ranking audio files are to be played through the right wireless earpiece. In an embodiment, the protocol file may indicate that high relative ranking messages may be played completely before presenting a lower relative ranking message or conversation. In an embodiment, the personal communication system 101 may also evaluate the current functionalities of the personal communication system 101 (e.g., connected devices, bandwidth available, current device settings, 3-D software installed, etc.) to determine the presentation parameters to apply to concurrent messages.

In an embodiment, the protocol file may contain device settings, such as volume or fidelity settings (e.g., playback bitrate), that may be applied to various relative rankings or types of messages. The protocol file may include rules that describe the schedule (or timing) for playing messages. For example, the protocol file may instruct the personal communication system 101 to pause an in-progress (i.e., currently rendering/playing) message to begin playing a higher relative ranking message. In embodiment, the protocol file may instruct the personal communication system 101 to transmit a status message to the various contacts based on the relative rankings. For example, the personal communication system 101 may transmit a whisper audio message to a message sender indicating that the sender's message is currently waiting to be played by the personal communication system 101.

In an embodiment, the protocol file may include rules to employ presentation parameters regardless of the determined relative rankings and based exclusively on the identities of message senders (e.g., sender ID or caller ID). For example, the protocol file rules may specify that the personal communication system 101 should always play a whisper message from a particular sender in the left wireless earpiece. The protocol file rules may also define presentation parameters based on other basic characteristics of received messages, such as message urgency or message type (e.g., whisper message, email, SMS text message, etc.). For example, a rule may specify that the personal communication system 101 should play whisper messages in the left wireless earpiece or use a higher playback volume when playing voice synthesized SMS text messages.

In an embodiment, the protocol file may include rules specifying preprocessing of a message before being played. For example, a protocol file rule may require that a lower relative ranking audio file be processed through a sampling software routine so that it does not interfere with a higher relative ranking message or conversation. For example, the personal communication system 101 may preprocess an audio file to muffle or distort the original audio message so that the user hears it as a background sound with sufficient clarity so that the user can discern that another person is speaking but without interfering with a primary message or conversation being played at the same time. In an embodiment, the personal communication system 101 may apply filtering or similar effects to streaming audio data (e.g., voice conversations) and may store un-filtered versions of audio messages. For example, for a real-time voice data stream (e.g., a voice call), the personal communication system 101 may apply an audio filter to the voice data as the data is received by the personal communication system 101. A further description of various preprocessing in presentation parameters is provided below with reference to FIG. 8.

In block 430, the personal communication system 101 may display/play the first and second messages based on the presentation parameters determined in block 425. The presentation parameters may be included in the protocol file. In an embodiment, the presentation parameters may display the first and/or second messages on a personal communication system 101 device (e.g., the mobile device 102, or another component) and alternatively or in combination play the first and/or second messages in one or more wireless earpieces 104, 104'. In an embodiment, if the messages have different durations, the personal communication system 101 may revert to normal audio settings for one of the messages or conversations when only a single message/conversation is being played. For example, when a higher relative ranking message concludes, the personal communication system 101 may begin playing a lower relative ranking message with normal audio settings.

In an embodiment, information regarding how a message was played to the recipient may be transmitted back to a sender of the message, such as in the form of a delivery confirmation message. For example, the personal communication system 101 may transmit back to the message sender that it determined the sender's whisper message to be of a lower relative ranking and played the message at low-volume and muffled. If the sender also employs a similar personal communications system 101 (e.g., the mobile device 102, one or both wireless earpieces 104, 104' and/or other components), the sender's personal communication system 101 may play for the sender any messages and/or conversations received from the user's personal communication system 101 using the same presentation parameters. For example, if the user's personal communication system 101 plays a whisper message from the sender at a low volume and/or with a muffled effect, then the sender's personal communication system 101 may play a whisper message from the user at a similarly low volume and/or muffled effect. In this manner, the sender can understand how a message was played for the recipient.

In an embodiment, the personal communication system 101 may transmit messages to the senders of the first and second messages indicating the relative rankings assigned to their message, the order in which the message was played to be recipient, and other determinations made by the personal communication system 101 during the operations of the method 400. For example, the personal communication system 101 may transmit status messages to the senders describing operations being performed on their message or conversation pending delivery (e.g., the personal communication system 101 is playing a whisper message from another sender, the personal communication system 101 is in stand-by mode, etc.). Such status messages may include information about the active devices of the personal communication system 101, the user's interaction (or presence) with respect to the personal communication system 101 devices (e.g., whether the user is wearing one or both earpieces), and other information that may inform the senders regarding how the personal communication system 101 is processing and playing their messages and/or conversations. For example, a sender's personal communication system 101 may receive whisper messages from the personal communication system 101 that indicate the user is engaged in another active conversation or message. As another example, the personal communication system 101 may transmit a whisper message to the sender that includes audio of the user talking in a muffled/distorted fashion to another party. As another example, the personal communication system 101 may transmit a message to the sender's personal communication system 101 that indicates the sender's message is in a suspended or paused state in the user's personal communication system 101. For example, the personal communication system 101 may send a whisper message to the sender's personal communication system 101 containing audio explaining that the recipient had to pause the conversation with the sender to listen to a higher priority whisper message.

Figure 5:
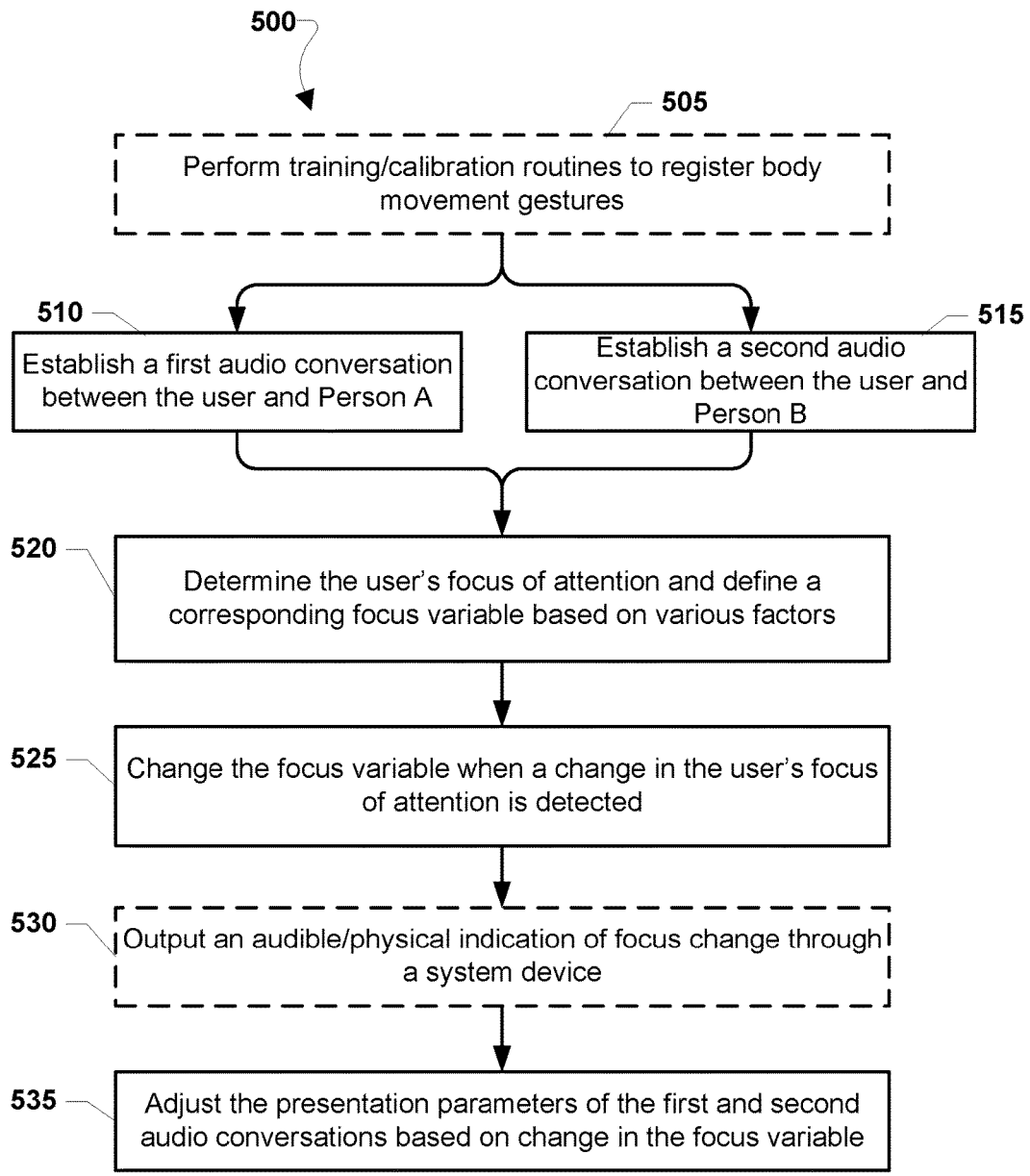
FIG. 5 is a process flow diagram illustrating an embodiment method for adjusting a focus of attention for multiple conversations.

FIG. 5 illustrates a method 500 for modifying priorities among multiple messages when the user's focus of attention changes. A focus variable based on an estimation of the user's focus of attention may be used to decide which and how colliding messages will be played for the user. For example, the personal communication system 101 (e.g., the mobile device 102, one or both wireless earpieces 104, 104' and/or other components) may determine from user actions that the user is focused on a two-way audio conversation when the personal communication system 101 receives additional colliding audio messages. So long as the user's attention remains focused on the two-way audio conversation, the personal communication system 101 may delay, play quietly, or muffle one or more of the received messages. However, if the user's attention shifts, as if to listen to one of the messages, this may be reflected in a change of the focus variable, which may result in the playing of one of the colliding messages in a clear manner while the two-way audio conversation is quieted, moved to one ear, muffled, put on hold, or otherwise modified to enable the user to clearly hear the message. The manner in which the personal communication system 101 responds to changes in the user's focus of attention may be defined in the protocol file, such as in the form of a rule.

The personal communication system 101 may adjust the focus variable in response to inputs from the user, such as tapping on a physical button, or an icon displayed on a user interface. For example, the personal communication system 101 may receive inputs from user interactions with a touch screen on the mobile device or recognized voice commands received by a microphone.

In another embodiment, the personal communication system 101 may include multiple devices (e.g., a mobile device, wrist-mounted devices, and/or one or both wireless earpieces) that may contain sensors (or a sensor pack) that measure and collect motion data that may be used to characterize anatomical movements. A motion sensor pack may include one or more of gyroscopes, magnetometers, and accelerometers. The personal communication system 101 may be configured to monitor motion sensors in the communication devices, such as accelerometers within the earpieces, in order to detect body movements. Detected body movements, such as motions of the head may be compared to a database of registered body movement gestures in order to recognize movement gestures (e.g., a nod of the head, shaking the head left and right, etc.). The database of registered body movement gestures may be stored in memory and relate particular movement gestures to selected personal communication system 101 commands (e.g., selecting particular messages to focus on, shifting from one message to another, replaying whisper messages, device controls, etc.).

In another embodiment, the personal communication system 101 devices (e.g., a mobile device, wrist-mounted devices, and/or one or both wireless earpieces) may include sensors or physical buttons that are correlated to a particular action, such as the user selecting a particular message or conversation to focus on or the user shifting from one message to another. For example, the personal communication system 101 may receive a double tap input from the user pressing a button twice on the right wireless earpiece and, in response, configure the personal communication system 101 to focus on the first audio message or conversation in the right earpiece by increasing the volume and muffling the sound of the second audio message or conversation in the left wireless earpiece.

In optional block 505 of method 500, the personal communication system 101 may perform training or calibration routines to register body movement gestures. In such training or calibration routines, the user may be prompted to turn his/her head or perform defined movements while the personal communication system 101 monitors motion sensor data received from the various communication components. Users may be asked to perform the same routine a number of times so that the average and range of the motion sensor data from those movements can be gathered. Motion sensor data gathered while the user performs prescribed movements may then be used to create a database of registered body movement gestures. Thereafter, sensor data received from motion sensors within personal communication system 101 components can be compared to that database in order to recognize whether the user is performing a gesture for which the personal communication system 101 (and the user) have been trained.

The database of registered body movement gestures may store positional and motion information for a set of gestures commonly executed by the user. In an embodiment, the personal communication system 101 may incorporate motion data from additional devices, such as wrist worn devices, to enable a larger range of user input gestures. For example, the personal communication system 101 may combine motion data from a first wrist-mounted device to recognize a swipe gesture which may be correlated to changing the message or conversation on which the user wants to focus.

In block 510, the personal communication system 101 may establish a first audio conversation between the user and Person A, at or around the same time that the personal communication system 101 may establish a second audio conversation between the user and Person B in block 515. Either the user or the other person (e.g., Person A or Person B) may have initiated the conversation by sending an audio message to the other's mobile device. As discussed above, an audio message may include whisper messages, SMS text messages processed by a speech synthesizer, emails processed by a speech synthesizer, and other audible messages played over the wireless earpieces.

In block 520, the personal communication system 101 may determine the user's focus of attention and define a corresponding focus variable based on various factors, such as user inputs (e.g., a button press on a user interface), a user's body position or movements, the order in which messages and/or conversations were started, voice commands, a file, priority list ranks, preferences, and/or other inputs and factors. Examples of user inputs that may be detected by the personal communication system 101 and result in focus variable adjustment are described below with reference to FIGS. 9A-9D.

The focus variable may remain unchanged so long as the user's focus remains the same. Thus, the manner in which the colliding messages and/or conversations are played in the earpieces may remain the same until a change in the user's focus is detected. When a change in the user's focus of attention is detected by the personal communication system 101, the personal communication system 101 may change the focus variable in block 525. For example, if the personal communication system 101 determines that the user has turned his/her head from left to right, this may be interpreted as a shifting the user's focus of attention from a message or conversation being played in the left earpiece to a message or conversation being played in the right earpiece. By changing the focus variable accordingly, the processes for determining message/conversation relative priority can accommodate the change in the user's focus of attention. This may involve changing the way that the colliding messages and/or conversations are played in each ear. To accomplish this, the personal communication system 101 may access the protocol file each time the personal communication system 101 changes the focus variable. In an embodiment, the personal communication system 101 may update a data table that describes the relative ranking of each active message or audio conversation when it determines a change in the focus variable. For example, the personal communication system 101 may maintain a data table of all active whisper messages and may modify a relative ranking for each whisper message when the focus variable changes.

In an embodiment, detected user inputs may change message, device, or general settings of the personal communication system 101 without changing the focus or relative ranking of messages and/or conversations played by the personal communication system 101. For example, the personal communication system 101 may recognize motion data patterns as a user motion gesture corresponding to a command to lower the volume on a particular whisper message being played. As another example, the user may press a GUI button that causes the wireless earpieces to switch the whisper messages that each earpiece plays. In these examples, the focus variable and relative rankings of the colliding messages and/or conversations may remain the same.

In optional block 530, the personal communication system 101 may output an audible/physical indication of focus change through a device coupled to the personal communication system 101. For example, the personal communication system 101 may provide an audible or tactile indication through the mobile device 102, one or both wireless earpieces 104, 104', or other connected devices to inform the user of the change in the focus variable. The personal communication system 101 may play a beep through one or both wireless earpieces, vibrate the mobile device, or flash a graphic on the mobile device's display when the personal communication system 101 changes the focus variable. This indication, which may be sensed by the user, may enable the user to understand why the sounds of the messages and/or conversations are changing. In an embodiment, the personal communication system 101 may also transmit a status message to senders of the colliding messages and/or conversations informing them that a change in the user focus has occurred. This may be in the form of a beep, vibration, or other signal, and permit the sender to consider changing their message or conversation until the user's focus returns to them.

In block 535, the personal communication system 101 may adjust the presentation parameters of the first and second audio conversations based on a change in the focus variable. For example, the personal communication system 101 may increase the volume for the message or conversation on which the user is now focused while decreasing the volume of the other messages and/or conversations. As another example, the personal communication system 101 may stop muffling a message or conversation that has now become the focus of attention, while muffling a message or conversation that was being played in a clear manner before the change in user focus.

Figure 6A:
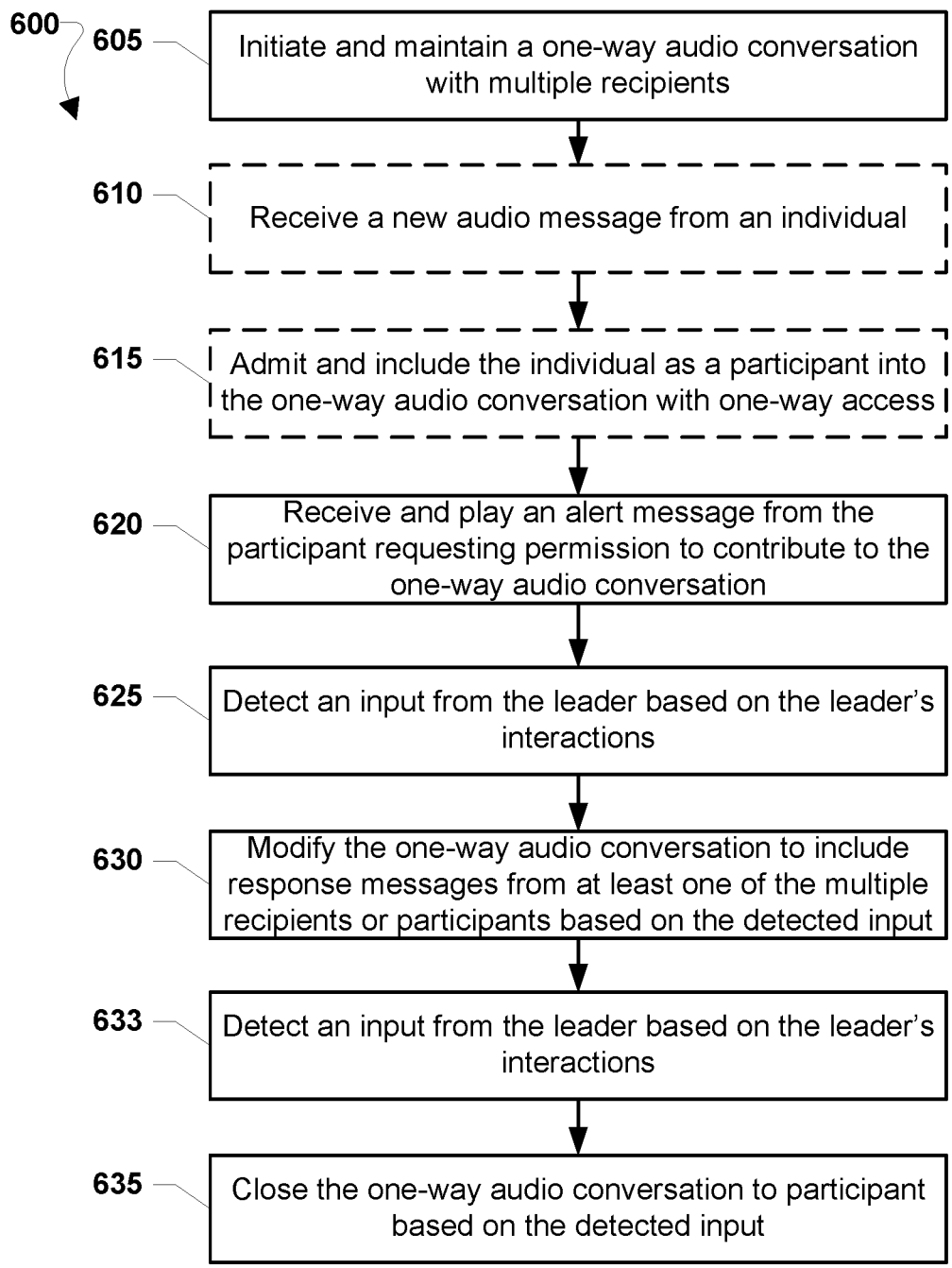
FIGS. 6A-6B are process flow diagrams illustrating embodiment methods for conducting one-way Whisper conversations.
Figure 6B:
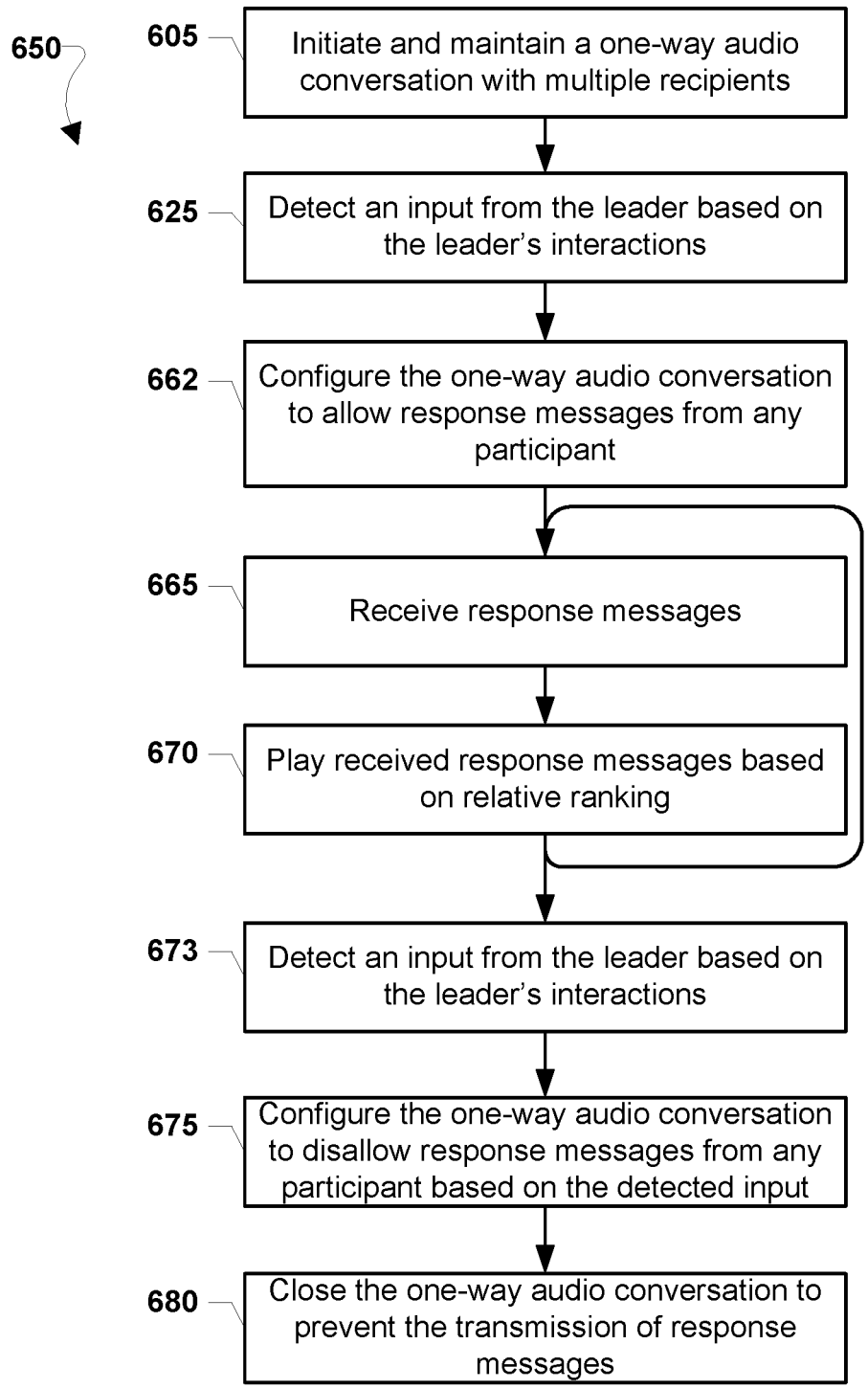

FIGS. 6A-6B illustrate embodiment methods 600, 650 for conducting one-way conversations with multiple recipients. For the purposes of discussing FIG. 6A and FIG. 6B, the term "leader" refers to the party controlling the one-way conversation, the term "recipient(s)" refers to a party receiving messages relating to the one-way conversation, and the term "participant(s)" refers to a recipient who provides messages as contributions to the one-way conversation.

The one-way conversation may be a series of messages or an on-going, active communication and may include voice memos, whisper messages, SMS text messages, or any other form of electronic communication. For example, the leader's personal communication system 101 (e.g., the mobile device 102, one or both wireless earpieces 104, 104' and/or other components) may establish a real-time conversation using whisper services/messages between the leader and recipients (e.g., a "group" audio conversation). Examples of one-way conversation scenarios may include speeches, webinars, or lectures that are conducted by a leader's personal communication system 101 and distributed to many recipients.

The one-way conversation may incorporate permissions logic that disallows recipients from freely responding in the context of the one-way conversation. For example, the conversation may be a series of messages unilaterally transmitted by the leader's personal communication system 101. The leader's personal communication system 101 may encode conversation messages with metadata that prohibits recipient devices from "replying" or "replying to all." With such permissions or encodings, the leader's personal communication system 101 may control the recipients' contributions to the conversation.

In various embodiments, the leader and the recipients may employ systems 101 of devices as described above (e.g., employing a mobile device and wireless earpieces capable of generating and transmitted whisper messages). The recipients and leader may be included as contacts or entries within the privileged contact lists stored within their respective personal communication system 101 devices. For example, whisper audio messages may automatically play in the leader's personal communication system 101 when received from a recipient represented in the leader's privileged contact list. In an embodiment, characteristics of the conversation (i.e., closed to recipient contribution), may be represented on the various devices of the leader and recipient the personal communication systems 101. For example, the recipients' mobile device may display text or render the color red on the display to indicate the conversation is closed to recipient response messages.

Referring to FIG. 6A, in block 605, the leader's personal communication system 101 (e.g., the mobile device 102, one or both wireless earpieces 104, 104' and/or other components) may initiate and maintain a one-way conversation with multiple recipients. In optional block 610, the leader's personal communication system 101 may receive a new audio message from an individual. In an embodiment, the received new audio message may indicate the individual's desire to enter into the one-way conversation as a recipient. In optional block 615, the leader's personal communication system 101 may admit and include the individual as a participant into the one-way audio conversation with one-way access. In an embodiment, the leader's personal communication system 101 may transmit an invitation message to the individual's devices or alternatively may begin transmitting the active one-way audio conversation data to the individual.

In block 620, the leader's personal communication system 101 may receive and play an alert message from the participant requesting permission to contribute to the one-way audio conversation. The alert message may be a whisper service, voice-synthesized text message, or other audio message in which the participant asks the leader for permission to transmit messages to all recipients of the one-way conversation. For example, the participant may transmit a whisper message that is played over the leader's wireless earpieces 104, 104' such as, "Professor, with your permission, I would like to address the group." In another embodiment, the participant may not request to contribute to the one-way audio conversation, but instead may present a private statement or question to the leader. The participant may initiate the alert message transmission by providing an input to his/her devices, as is described below with reference to the operations in block 625. For example, the participant, employing a wrist-mounted device, may transmit the alert to the leader's personal communication system 101 by raising his/her hand In block 625, in response to the alert message, the leader's personal communication system 101 may detect an input from the leader based on the leader's interactions. For example, the leader may press GUI buttons labeled "Allow"/ "Deny" and displayed on his/her mobile device. As another example, the leader's personal communication system 101 may detect that the leader moved his hand forward as if handing over a microphone. As other examples, the leader's personal communication system 101 may recognize spoken commands, the leader pressing a physical button on one or more earpieces, or the leader pressing a GUI button on a touchscreen user interface. Recognizing gestures and executing corresponding software commands are described above.

In block 630, the leader's personal communication system 101 may modify the one-way audio conversation to include response messages from at least one of the multiple recipients or participants based on the input detected in block 625. In an embodiment, the leader's personal communication system 101 may transmit an authentication code, a confirmation message, or any other message including instructions or validating information to enable the participant's personal communication system 101 to generate messages for the one-way conversation. For example, the leader's personal communication system 101 may send a whisper conversation code to the participant's personal communication system 101 that may enable the participant's personal communication system 101 to generate and transmit whisper messages to all conversation recipients. In another embodiment, the leader's personal communication system 101 may act as a routing device that may receive all participant messages regarding the one-way audio conversation and transmit the received participant messages to recipients.

In block 633, the leader's personal communication system 101 may detect an input from the leader, for example, as described above with reference to block 625. For example, the leader may press a GUI button labeled "Regain Control" on the mobile device.

In block 635, the leader's personal communication system 101 may close the one-way audio conversation to participant based on the detected input from the leader in the preceding block 625. For example, in response to detecting that the leader pulled his arm back towards his body (as if taking back a microphone), the leader's personal communication system 101 may execute operations to remove the participant's permission to transmit messages to the recipients. In an embodiment, the leader's personal communication system 101 may transmit a message to the participant and/or the recipients indicating the leader's regained control of the conversation. For example, the participant's mobile device may display a red stop sign graphic on the display unit when the leader resumes control of the conversation.

FIG. 6B illustrates another embodiment method 650 for conducting a one-way audio conversation with multiple recipients. The method 650 and associated systems are similar to the method and systems described above with reference to FIG. 6A. However, this method 650 may enable the leader's personal communication system 101 (e.g., the mobile device 102, one or both wireless earpieces 104, 104' and/or other components) that starts and/or controls an audio message or conversation to temporarily relinquish control and open the conversation to response messages (or contributions) from multiple participants. For example, a teacher may ask a hypothetical question during a one-way whisper conversation "lecture," and may open the conversation to receive responses from student participants.

In block 605, as described above, the leader's personal communication system 101 may initiate and maintain the one-way conversation, such as a whisper voice conversation. The one-way conversation may include multiple recipients and the leader, all of whom may employ the personal communication systems 101 for exchanging messages (e.g., a mobile device and wireless earpieces). In block 625, as described above, the leader's personal communication system 101 may detect an input from the leader based on the leader's interactions (e.g., GUI button input, a spoken command, and/or body movement gestures). These interactions may be recognized by the leader's personal communication system 101 to correspond to software commands for configuring a temporarily open voice conversation. For example, based on gyroscope data from the wireless earpieces, the leader's personal communication system 101 may detect the leader looking at the ceiling. As another example, the leader may push his hand forward, recognized as an input gesture by the leader's personal communication system 101 through a wrist-mounted device.

In an embodiment, the leader's personal communication system 101 may detect a pause or break in the conversation and determine a "pause" input from the leader. For example, the leader's personal communication system 101 may monitor a whisper voice message for sections in which the leader does not speak. The leader's personal communication system 101 may utilize threshold values when detecting pauses or breaks in speech and may only determine a pause input if the break in speech exceeds a predefined duration.

In block 662, based on the detected leader input in block 625, the leader's personal communication system 101 may configure the one-way audio conversation to allow response messages from any participant. In other words, the one-way audio conversation may be in a temporarily open status to allow response messages (e.g., whisper memo comments, questions, or other inputs). The leader's personal communication system 101 may configure the conversation to include response messages from particular participants based on participant identity (e.g., contact name/code), the priority or relative ranking of the response messages as defined in metadata, or any other attribute or characteristic that may be predefined by the leader or stored within a configuration file stored within the leader's personal communication system 101. For example, the conversation may be configured to accept response whisper audio memo messages only. As another example, each participant may only transmit a certain number of response messages for a period of time.

In an embodiment, the leader's personal communication system 101 may send messages or signals to the recipients indicating that the one-way conversation is temporarily open to response messages from the recipients. For example, the recipients' mobile device display units may play a text message, turn green, or an audio message may be played in wireless earpieces (e.g., "Ask questions now.")

In block 665, the leader's personal communication system 101 may receive response messages. These response messages may be whisper voice memos from numerous participants and may be overlapping or received concurrently, as described above with reference to FIG. 4.

In block 670, the leader's personal communication system 101 may play the response messages with presentation parameters based on relative ranking such as priority, metadata, or other message characteristics as described above. In an embodiment, the response messages may be transmitted to the recipients of the conversation where they may be played in similar ways by the recipient the personal communication systems 101. For example, a response whisper voice memo may be received by the leader's personal communication system 101, transmitted to some or all of the recipients currently engaged in the voice conversation, and played on the respective recipient and leader's the personal communication systems 101.

In block 673, the leader's personal communication system 101 may detect an input from the leader based on the leader's interactions, for example, as described above with reference to block 625. In block 675, the leader's personal communication system 101 may configure the one-way audio conversation to disallow response messages from any participant based on the input detected in block 673. In block 680, the leader's personal communication system 101 may close the one-way audio conversation to prevent the transmission of response messages. Closing of the one-way audio conversation may be accomplished in response to an event or input, such as the end of a predefined time limit (e.g., the scheduled conversation time expires, immediately upon completing the operations in block 675, etc.), a detected input command from the leader (e.g., the leader presses the "End" GUI button on his/her mobile device), or the exit of all recipients from the conversation (e.g., every recipient ended their connection to the whisper voice conversation).

Figure 7:
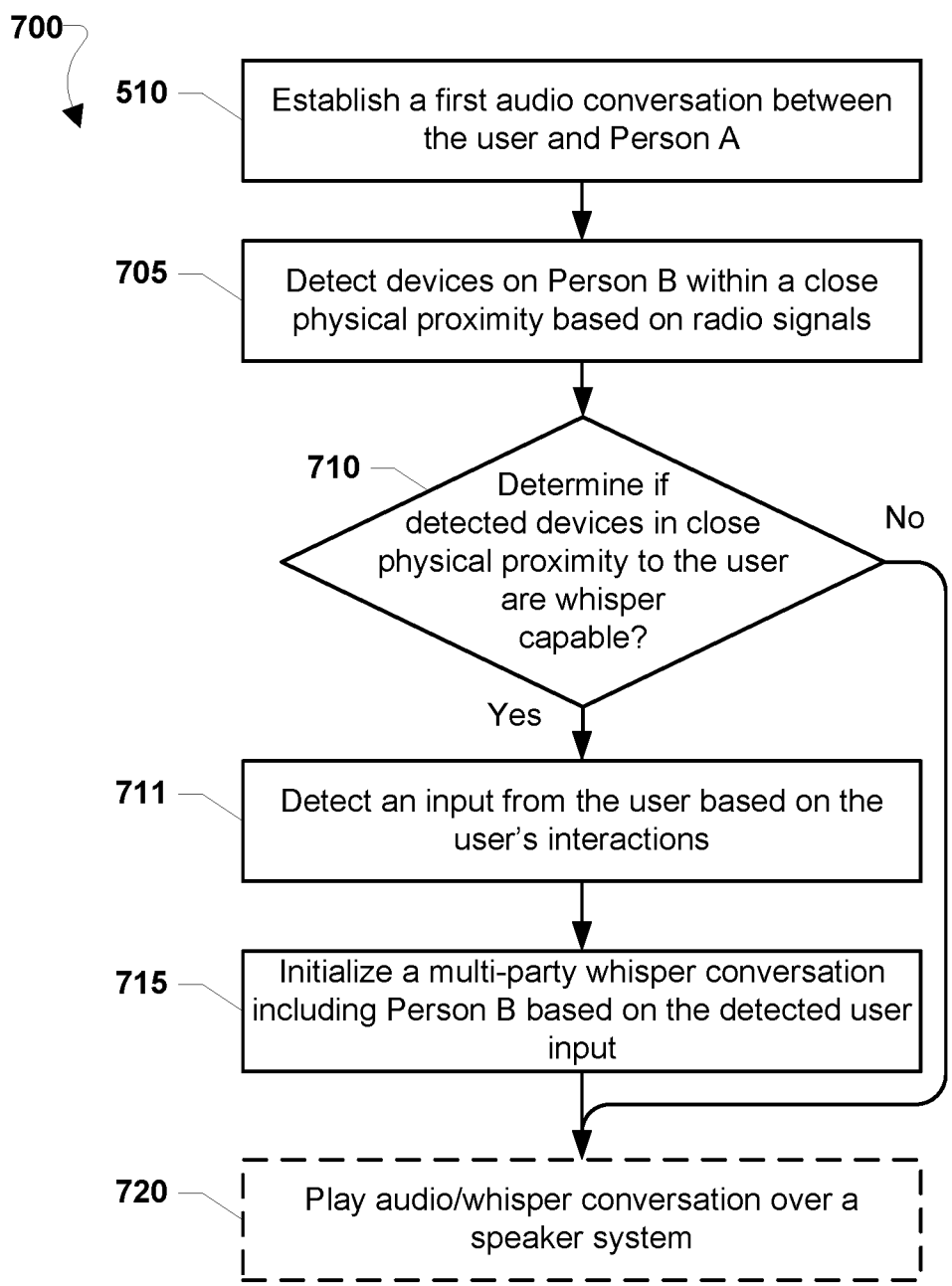
FIG. 7 is a process flow diagram illustrating an embodiment method for adding new Whisper conversation participants using radio signals.

FIG. 7 illustrates an embodiment method 700 for adding new whisper audio conversation participants based on radio signals. A user, employing a personal communication system 101 (e.g., the mobile device 102, one or both wireless earpieces 104, 104' and/or other components) may wish to add new participants to active whisper messages and/or conversations. In an exemplary scenario, the user may conduct a whisper audio conversation with a remote participant and encounter a physically-close party with whom the user may wish to include in the active whisper audio conversation. The personal communication system 101 may detect whisper capabilities or devices used by the physically-close party and may establish a multi-voice conversation between the user, the remote participant, and the physically-close party.

In block 510, as described above, the personal communication system 101 may establish a first audio conversation with the user and Person A. The personal communication system 101 may exchange and play messages, such as SMS text, email, and whisper audio messages between the user and Person A.

In block 705, the personal communication system 101 may detect devices on Person B within a close physical proximity based on radio signals. The devices within the personal communication system 101, such as the mobile device and one or both wireless earpieces 104, 104', may include short-range radio transceivers (e.g., Bluetooth®, Zigbee®, Peanut®, WiFi, NFC, or RF radios). The personal communication system 101 may periodically instruct such transceivers to transmit signals that may be received and responded to by similar nearby transceivers included within devices of the physically-close party. Based on the communication protocols implemented, the nearby transceivers may be configured to be in a "discoverable" mode to provide the personal communication system 101 with responsive radio signals.

In an embodiment, the personal communication system 101 may detect potential participants based on determined device locations. For example, the personal communication system 101 may query wireless router stored data describing wireless user devices to determine the device locations. The personal communication system 101 may also query devices for GPS coordinates or employ radio signal ranging techniques to determine devices within close physical proximity In an embodiment, the personal communication system 101 may also access social media websites for location information about persons in the user's privileged contact list. For example, the personal communication system 101 may query a contact's Facebook, Twitter, FourSquare, or other online social media accounts to determine whether the contact is located near the user.

In determination block 710, the personal communication system 101 determines whether the detected devices in close physical proximity to the user are whisper capable. For example, based on the reception of response Bluetooth® signals, the personal communication system 101 may determine the machine address of the Bluetooth® transceiver within the physically-close detected device. The personal communication system 101 may query a database storing descriptive information (e.g., the machine addresses, associated devices, contact identity, etc.) for devices capable of conducting whisper messages. In an embodiment, the personal communication system 101 and physically-close party may employ a whisper app that may use device resources, such as short-range radio transceivers, to determine nearby compatible devices.

In an embodiment, the personal communication system 101 may cross reference whisper database information with contact information, such as privileged contact lists, stored within the personal communication system 101 to determine whether the physically-close party is known to the personal communication system 101.

If the detected devices in close physical proximity to the user are whisper capable (i.e., determination block 710="Yes"), the personal communication system 101, in block 711, may detect an input from the user based on the user's interactions. In an embodiment, if whisper capable devices are detected, the personal communication system 101 may render an indication of the physically-close party's availability to participate in the whisper conversation on the user's mobile device. In an embodiment, the user's interactions in block 711 may be recognized as commands to include the physically-close party in the whisper conversation. For example, the user may tap GUI buttons "Add"/"Ignore" on the mobile device in response to displayed text that indicates the physically-close party may be added to the whisper conversation. As another example, the system 101 may detect a user gesture, such as a head not in the direction of the physically-close party, that may be recognized as corresponding to software commands for adding the physically-close party to the whisper conversation.

In block 715, based on the user input detected in block 711, the personal communication system 101 may initialize a multi-party whisper conversation including Person B. The full multi-party whisper conversation would include the user, the remote participant, and the physically-close party, or Person B. The personal communication system 101 may transmit whisper messages to the physically-close party's devices for playing. In an embodiment, the personal communication system 101 may receive and route messages and data from the physically-close party for delivery to the remote participant. Alternatively, the personal communication system 101 may transmit a code or software instructions to the physically-close party that may enable the physically-close party's device to directly communicate with the remote participant and the personal communication system 101 concurrently.

If the detected devices in close physical proximity to the user are not whisper capable (i.e., determination block 710="No"), in optional block 720, the personal communication system 101 may play the audio/whisper conversation over a speaker system. The user may desire to share the conversation with the physically-close party because the physically-close party does not have devices that are whisper capable. For example, the personal communication system 101 may play whisper audio through the loudspeaker unit within the mobile device 102 or wireless earpieces 104, 104'. In an embodiment, the personal communication system 101 may connect to a local sound system, such as a building's intercom system, and transmit the whisper audio for playing over the sound system.

Figure 8:
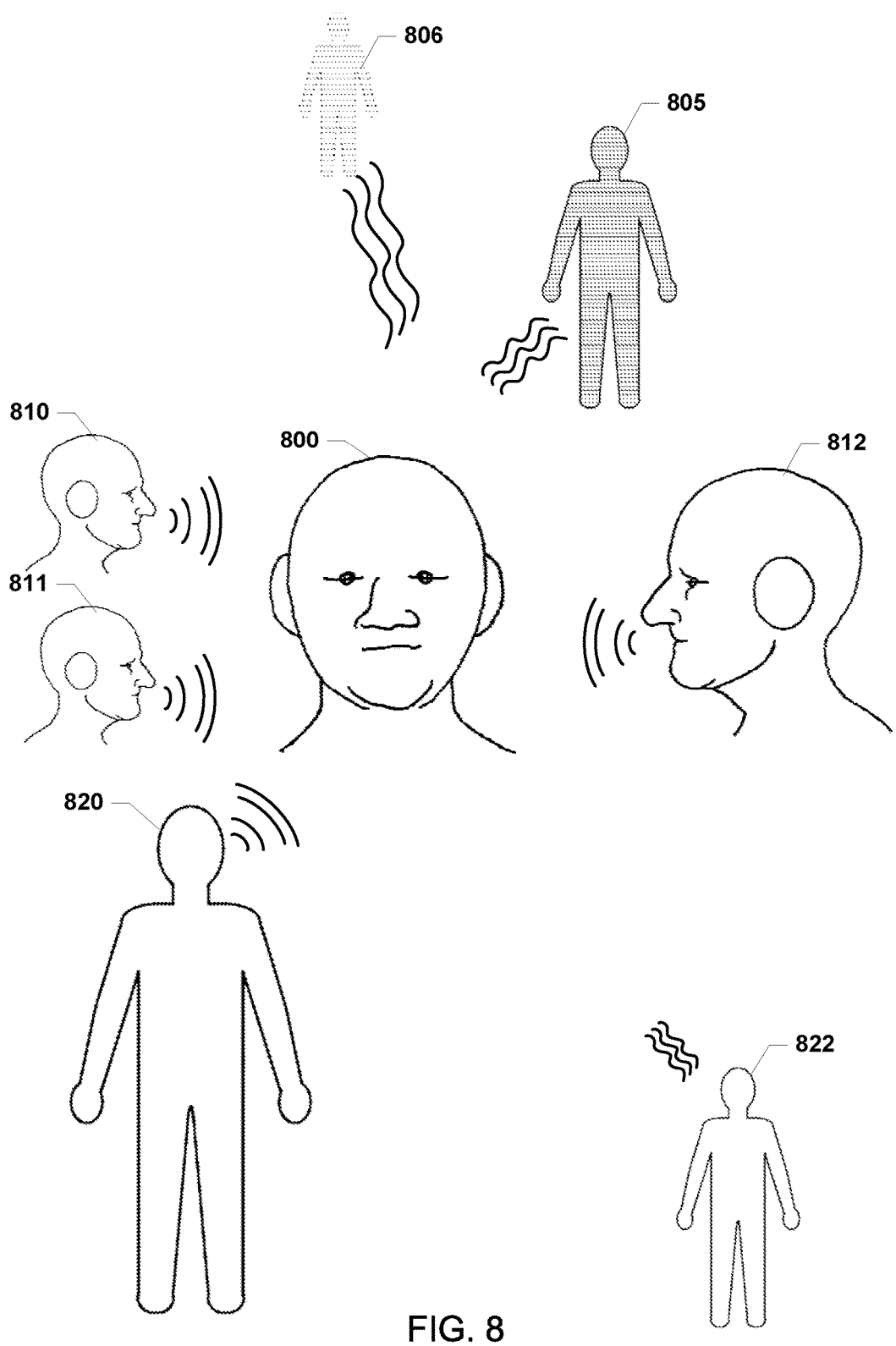
FIG. 8 is a diagram showing various vocal position and quality presentations of conversations managed by a recipient personal communication system.

FIG. 8 is a diagram illustrating various presentations of messages and/or conversations by a personal communication system 101 (e.g., the mobile device 102, one or both wireless earpieces 104, 104' and/or other components) as may be perceived by a user. As described above, the personal communication system 101 may distinguish between concurrent messages, either by relative ranking, priority, user preferences as defined in configuration files, or other methods of classifying the message based on its characteristics. The personal communication system 101 may present messages and/or conversations to the user 800 in different ways that are based on the message characteristics and that may assist the user 800 in distinguishing separate conversations played at the same time.

In an embodiment, the concurrent messages and/or conversations received by the personal communication system 101 may originate from different senders 805, 806, 810, 811, 812, 820, and 822, all of whom may be associated with contact entries of a stored privileged contact database accessible by the user's personal communication system 101. When the personal communication system 101 receives a message (e.g., a phone call, a whisper voice conversation message, an audio file, a text-to-audio/speech message, etc.), the personal communication system 101 may recognize the sender and process the message for playing. For example, a mobile device within the personal communication system 101 may receive a message, determine that the sender is on the user's privileged contact list, and transmit the message for playing.

In an embodiment, the personal communication system 101 may utilize conventional stereo techniques or three-dimensional ("3-D") audio software and techniques to play messages and/or conversations. 3-D capabilities may allow the personal communication system 101 to encode audio streams for playback in wireless earpieces 104 and 104' such that the user 800 may perceive sounds coming from different spatial orientations. For example, the user 800 may hear sounds that appear to be slightly in front and to the right side of the center of his head. As another example, the personal communication system 101 may play sounds that seem to emanate from above the user 800. The personal communication system 101 may employ the 3-D message encoding techniques to provide innumerable different presentations of concurrent messages and/or conversations.

The personal communication system 101 may use message characteristics (e.g., relative ranking, urgency, message type, metadata, etc.) and a protocol file to determine the presentation parameters, as described above. In an embodiment, the presentation parameters may instruct the personal communication system 101 to play concurrent messages and/or conversations to emulate near-far spatial relationships. For example, the personal communication system 101 may play the audio message from sender 806 so that it seems farther away from the user 800 than the audio message from sender 805. Similarly, the audio from sender 822 may seem farther away than the audio from sender 820 to the user 800. In an embodiment, the presentation parameters may cause the personal communication system 101 to play messages and/or conversations to emulate a front-back spatial relationship. For example, the audio from senders 820, 822 may be played so they are perceived by the user 800 as originating from his front while the audio from senders 806, 805 is played so that it is perceived as coming from behind the user 800. In an embodiment, the personal communication system 101 may play the audio messages and/or conversations so that the user 800 perceives audio from sender 810 as arriving from the right and audio from sender 812 arriving from the left. In an embodiment, the presentation parameters may cause the personal communication system 101 to play concurrent messages and/or conversations at different volume levels. For example, the personal communication system 101 may play the audio message from sender 810 at a higher volume than the audio from sender 811. In an embodiment, the presentation parameters may cause the personal communication system 101 to play concurrent messages and/or conversations using different sound effects, filters, or processing. For example, the personal communication system 101 may modify the audio messages and/or conversations from senders 806, 805, 822 using a filter that causes the audio to sound muffled or distorted.

In an embodiment, the personal communication system 101 may combine multiple audio effects, simulated spatial relationships, and other audio settings for individual messages and/or conversations. For example, presentation parameters may cause the personal communication system 101 to play the audio message from sender 806 so that the user 800 may perceive the audio to be arriving from behind, slightly on the right side, at a far distance, and with a muffled effect.

FIGS. 9A-9D illustrate example user actions for changing the user's focus of attention on messages/conversations that may cause the personal communication system 101 to change the way in which concurrent messages and/or conversations are played for the user. The user 900, employing a personal communication system 101 (e.g., the mobile device 102, one or both wireless earpieces 104, 104' and/or other components) may create personal communication system 101 input data by interacting with the devices (e.g., tapping, touching, rubbing, etc.) or moving such that motion data (e.g., arm gestures, head movements, etc.) is recognized by the personal communication system 101. In response to the created input data, the personal communication system 101 may determine corresponding instructions or commands that it may execute to change the focus variable, modify the presentation of playing messages, or otherwise adjust the system's functions. For example, the personal communication system 101 may pause a whisper audio message if it detects a focus change.

Figure 9A:
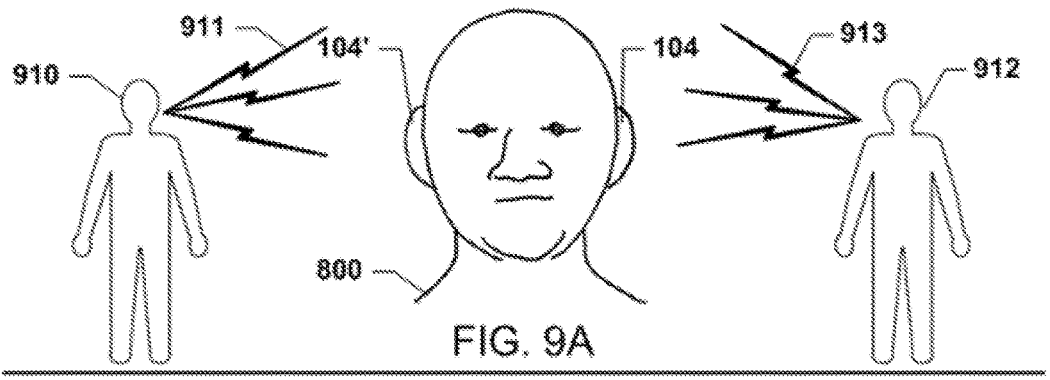
FIGS. 9A-9D are illustrations of gesture actions for changing focus that may be recognized using the various embodiments.

In FIG. 9A, the personal communication system 101 (e.g., the mobile device 102, one or both wireless earpieces 104, 104' and/or other components) may receive, process, and play messages and/or conversations from a sender A 910 and a sender B 912 at the same time. For example, the senders 910 and 912 may transmit whisper messages that are received by the personal communication system 101 at the same time. By default, the personal communication system 101 may play the message from the sender A 910 with a default presentation 911 in the right wireless earpiece 104' and the message from the sender B 912 with a similar presentation 913 in the left wireless earpiece 104. The user 900 may be looking straight forward and the focus may be equally apportioned to both messages and/or conversations. For example, the personal communication system 101 may play two whisper audio messages with presentations such that both audio signals are played at the same volume and with no filtering applied.

Figure 9B:
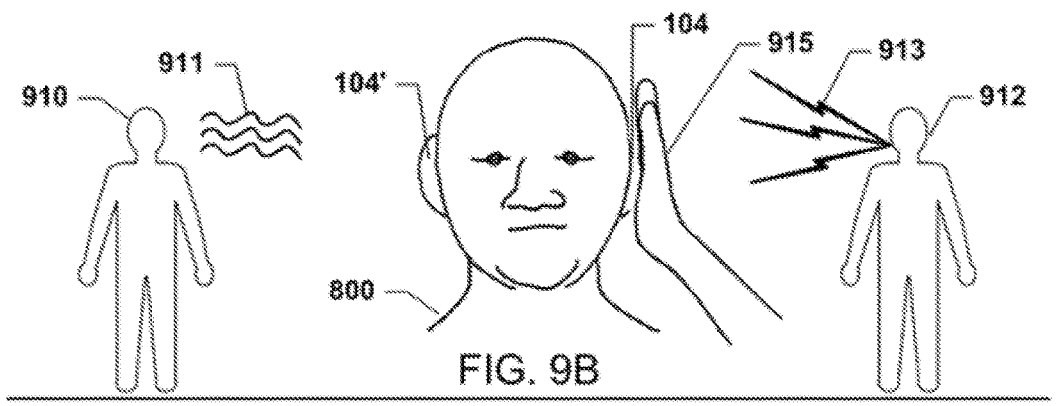

In FIG. 9B, the user 900 may adjust the focus variable by placing (or cupping) his/her hand 915 over the left wireless earpiece 104. The personal communication system 101 (e.g., the mobile device 102, one or both wireless earpieces 104, 104' and/or other components) may recognize that the hand 915 is placed over the left wireless earpiece 104 by feedback data from the speaker and/or microphone units within the left wireless earpiece 104, short-range radio signal techniques, or a combination of any. In response to determining that the hand 915 placed over the left wireless earpiece 104, the personal communication system 101 may change focus relative to both ear pieces 104, 104'. The personal communication system 101 may increase focus on the message played in the left earpiece 104 by removing focus from the message played in the right wireless earpiece 104'. To accomplish the user's desire to change the focus, the personal communication system 101 may re-evaluate the presentation parameters of the messages and/or conversations based on the focus adjustment, and may play the sender A's message with a muffled or distorted presentation 911.

Figure 9C:
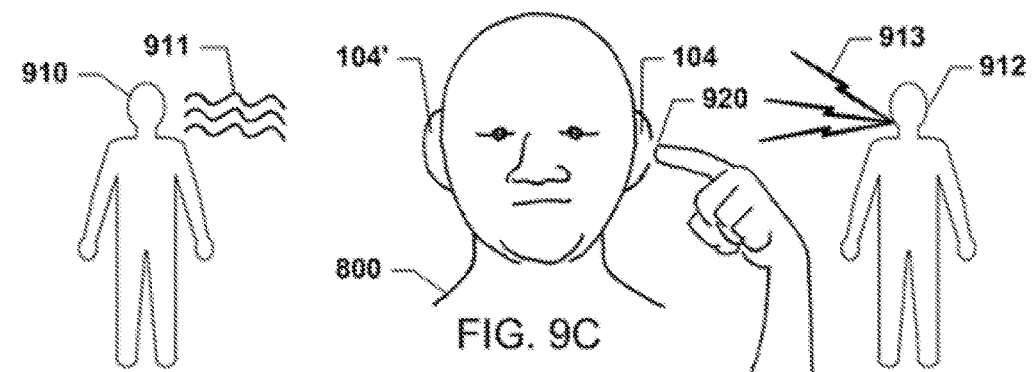

In FIG. 9C, the user 900 may adjust the focus variable by tapping his/her finger 920 on the left wireless earpiece 104. The wireless earpiece 104 may include a physical button configured to be depressed by user interaction and provide the personal communication system 101 with input data. In an embodiment, the personal communication system 101 (e.g., the mobile device 102, one or both wireless earpieces 104, 104' and/or other components) may recognize that the finger 920 tapped the wireless earpiece 104 by using motion data from sensors within the wireless earpiece 104. For example, the personal communication system 101 may interpret abrupt and violent motion data on the wireless earpiece 104 as a command to change focus to the message played in the left wireless earpiece 104. In response to recognizing the tapping as a selection command, the personal communication system 101 may remove focus from the message played in the right wireless earpiece 104'. The personal communication system 101 may re-evaluate the presentation parameters of the messages and/or conversations based on the focus adjustment, and may play the sender A's message with a muffled or distorted presentation 911.

Figure 9D:
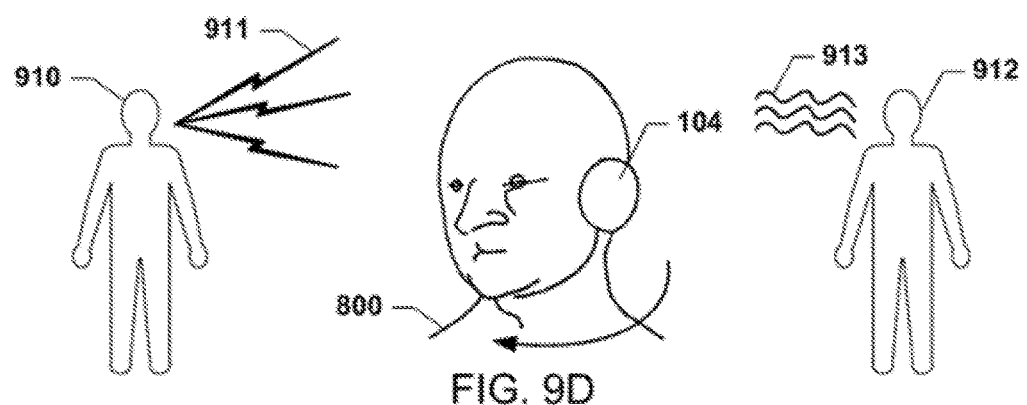

In FIG. 9D, the user 900 may adjust the focus variable by turning his head to the right side. The personal communication system 101 (e.g., the mobile device 102, one or both wireless earpieces 104, 104' and/or other components) may recognize the head turn by using motion data from sensors within the wireless earpieces 104 and 104'. For example, the personal communication system 101 may evaluate gyroscope motion data from both wireless earpieces 104 and 104' and determine that the user 900 turned his head to the right. The personal communication system 101 may recognize the head turn as a focus selection command and in response may remove focus from the message played in the left wireless earpiece 104. The personal communication system 101 may re-evaluate the presentation parameters of the messages and/or conversations based on the focus adjustment, and may play the sender B's message with a muffled or distorted presentation 913.

As described above, using stereo techniques or 3-D audio representation software and techniques as described above, the personal communication system 101 may play audio messages so that the user 900 perceives the audio coming from distinct locations around his physical location. In an embodiment, the personal communication system 101 may detect when the user 900 turns his/her head so that it is directed to a location in the middle of concurrent whisper audio messages. For example, the personal communication system 101 may evaluate gyroscope data from wireless earpieces and presentation parameters of actively playing whisper messages to determine the user 900 has turned his/her head in the middle of the whisper messages. In response to such a head turn, the personal communication system 101 may change the focus to both of the concurrent messages and/or conversations. In another embodiment, the personal communication system 101 may also transmit messages to create a group conversation between the contacts who sent the active messages and the user 900. For example, the personal communication system 101 may create a conference call between the user 900 and two contacts in response to the user's head pointing in a direction in between the perceived directions of the two callers.

In an embodiment, the personal communication system 101 may recognize many other body movement gestures based on motion data received from motion sensors within the wrist-mounted devices and/or wireless earpieces 104 and 104'. Body movement gestures using the wrist-mounted devices may include raising an arm up or down, swinging the arm from side to side, rotating the arm at the wrist, shaking the arm back and forth, and others of the like. Body movement gestures using the wireless earpieces 104 and 104' may include a head nod forward/backward/side, a head shake, and a head rotate to either side. The recognition of such gestures may be accomplished by processing motion data received from one or both of the wrist-mounted device motion sensors and the wireless earpiece motion sensors. As described above, the personal communication system 101 may store patterns of motion data correlated to particular gestures and gesture-initiated commands within a gestures database.

The personal communication system 101 may associate software commands with the gestures stored in the pre-defined gestures database. The commands may include instructions that change the functions of the mobile device, the wireless earpieces, or any other device connected to the personal communication system 101. In an embodiment, the commands may change personal communication system 101 variables, such as the focus variable. As an example, a quick shake of the head may stop the playing of all received messages and/or conversations.

In another embodiment, the personal communication system 101 may receive inputs from the user interacting with graphical displays on the mobile device or another device within the personal communication system 101. For example, the mobile device may display GUI buttons for each of the active whisper messages and/or conversations being played by the personal communication system 101. The user may change the focus of the personal communication system 101 by selecting (e.g., tapping, clicking, pressing, etc.) an area of a touch screen corresponding with a GUI button representing a particular message or conversation. In an embodiment, the personal communication system 101 may adjust the focus variable to put the personal communication system 101 focus on multiple messages and/or conversations. For example, several active whisper messages may receive the focus of the personal communication system 101.

Figure 10:
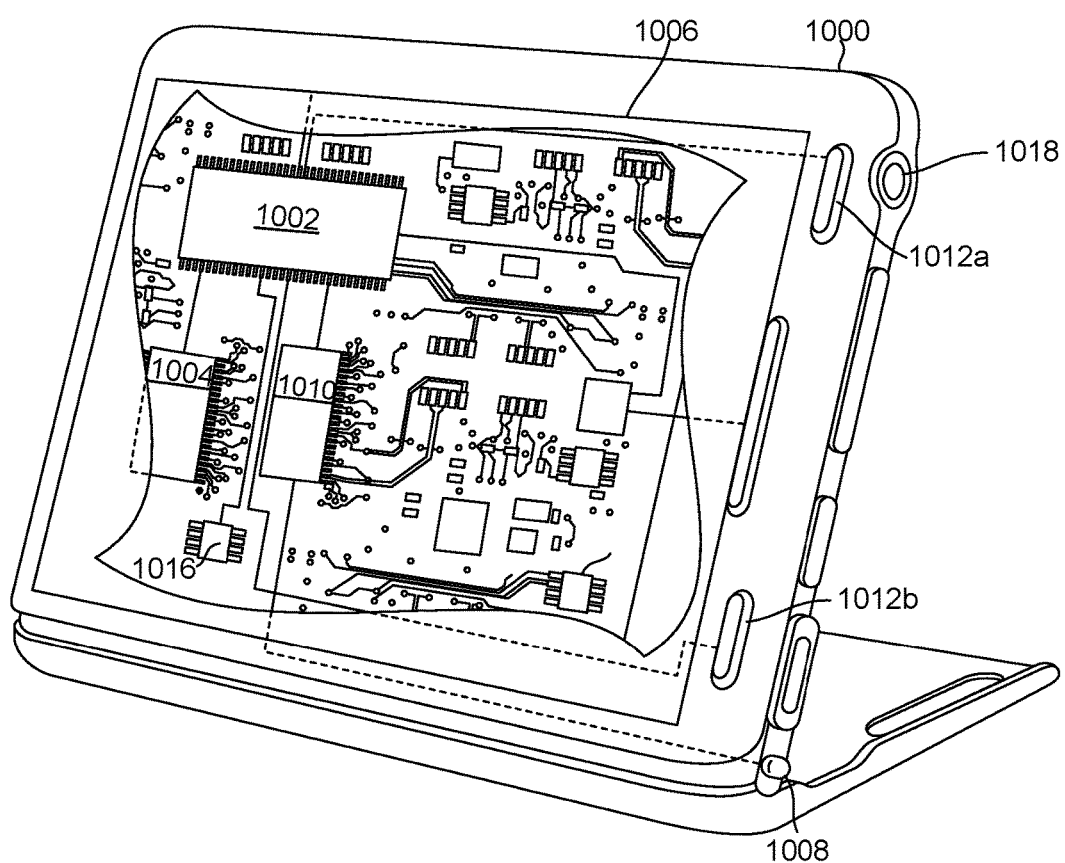
FIG. 10 is a component diagram of an example mobile device suitable for use with the various embodiments.
Figure 11:
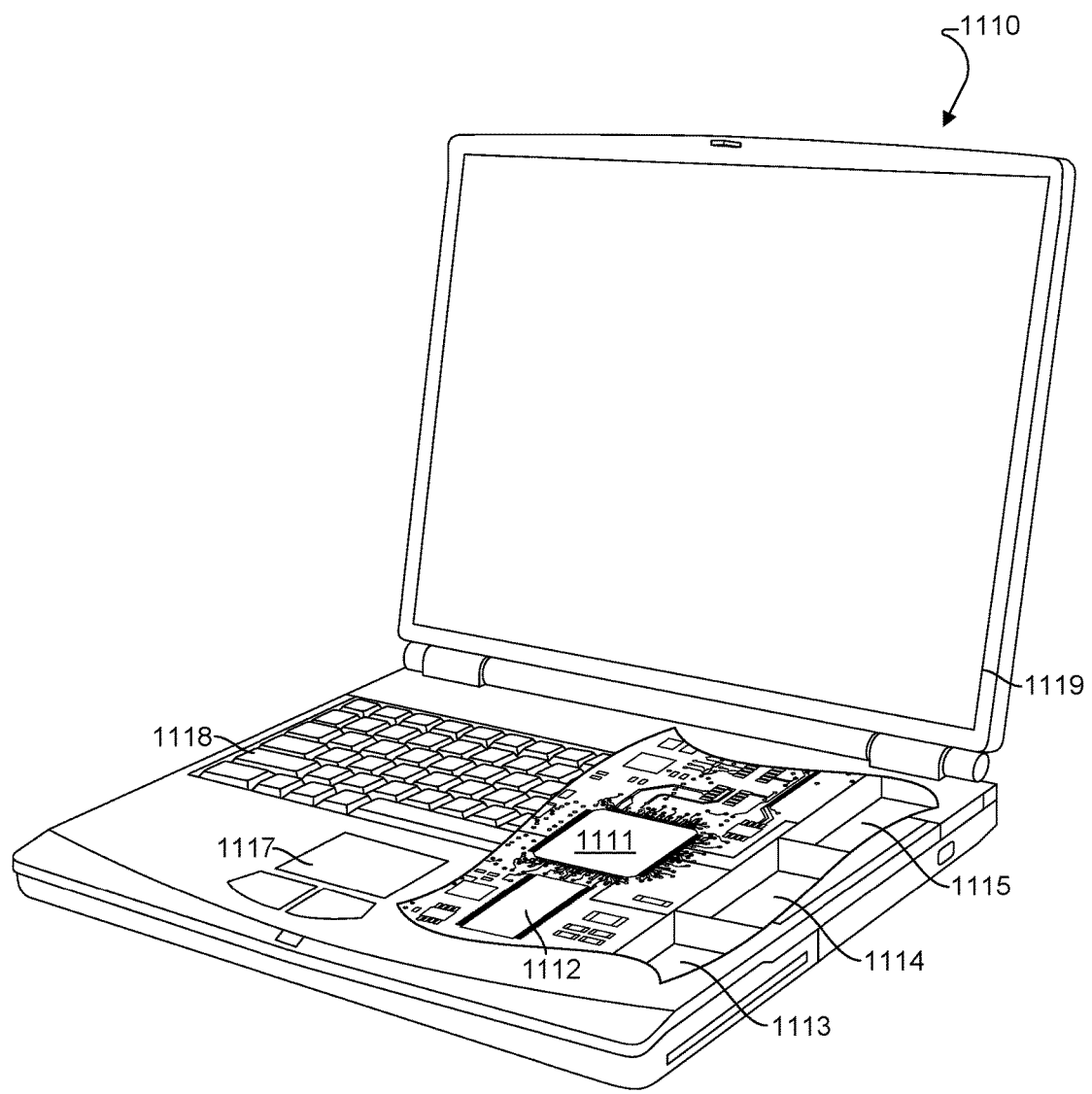
FIG. 11 is a component diagram of another example mobile device suitable for use with the various embodiments.

The various embodiments may be implemented in any of a variety of mobile devices, an example of which is illustrated in FIG. 10. For example, the tablet device 1000 may include a processor 1002 coupled to internal memories 1004 and 1010. Internal memories 1004 and 1010 may be volatile or non-volatile memories, and may also be secure and/or encrypted memories, or unsecure and/or unencrypted memories, or any combination thereof. The processor 1002 may also be coupled to a touch screen display 1006, such as a resistive-sensing touch screen, capacitive-sensing touch screen infrared sensing touch screen, or the like. Additionally, the display of the tablet device 1000 need not have touch screen capability. Additionally, the mobile device 1000 may have one or more antenna 1008 for sending and receiving electromagnetic radiation that may be connected to a wireless data transceiver and/or cellular telephone/data transceiver 1016 coupled to the processor 1002. The tablet device 1000 may also include physical buttons 1012a and 1012b for receiving user inputs. The tablet device 1000 may also include a power button 1018 for turning the tablet device 1000 on and off The various embodiments described above may also be implemented within a variety of mobile devices, such as a laptop computer 1110 as illustrated in FIG. 11. Many laptop computers include a touch pad touch surface 1117 that serves as the computer's pointing device, and thus may receive drag, scroll, and flick gestures similar to those implemented on mobile computing devices equipped with a touch screen display and described above. A laptop computer 1110 will typically include a processor 1111 coupled to volatile memory 1112 and a large capacity nonvolatile memory, such as a disk drive 1113 of Flash memory. The computer 1110 may also include a floppy disc drive 1114 and a compact disc (CD) drive 1115 coupled to the processor 1111. The computer device 1110 may also include a number of connector ports coupled to the processor 1111 for establishing data connections or receiving external memory devices, such as a wireless transceiver, a USB or FireWire® connector socket, or other network connection circuits for coupling the processor 1111 to a network. In a notebook configuration, the computer housing includes the touchpad 1117, the keyboard 1118, and the display 1119 all coupled to the processor 1111. Other configurations of the computing device may include a computer mouse or trackball coupled to the processor (e.g., via a USB input) as are well known, which may also be used in conjunction with the various embodiments.

Figure 12:
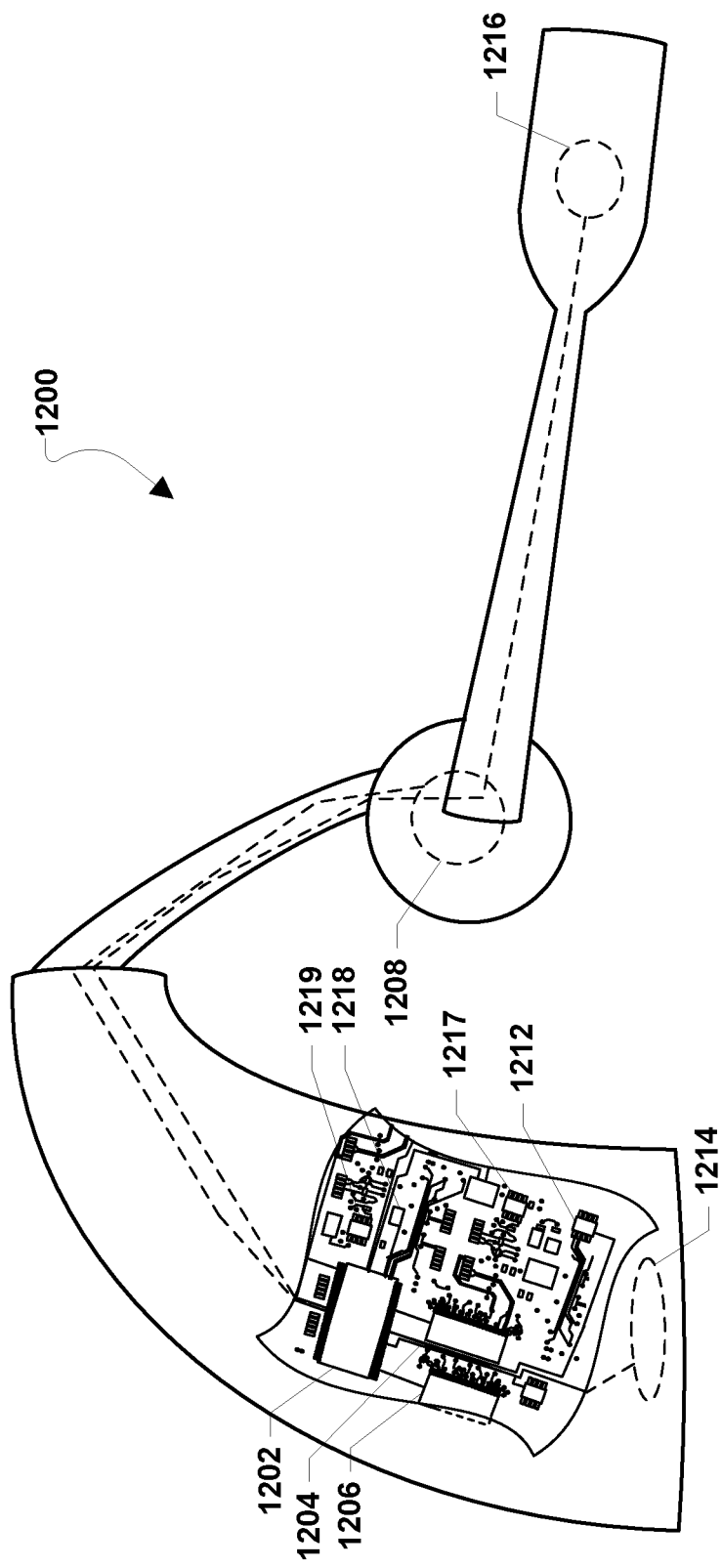
FIG. 12 is a component diagram of a wireless earpiece suitable for use with the various embodiments.

The various embodiments described above may also be implemented within a variety of wireless earpieces, such as wireless earpiece 1200 as illustrated in FIG. 12. A wireless earpiece 1200 may include a processor 1202 coupled to internal memories 1204 and 1206. Internal memories 1204 and 1206 may be volatile or non-volatile memories, and may also be secure and/or encrypted memories, or unsecure and/or unencrypted memories, or any combination thereof. The wireless earpiece 1200 may include a physical button 1214 for receiving user inputs. Additionally, the wireless earpiece 1200 may have one or more antenna 1212 for sending and receiving electromagnetic radiation that may be connected to a wireless transceiver coupled to the processor 1202. The wireless earpiece 1200 may include a speaker 1208 coupled to the processor 1202 and configured to generate an audio output. The wireless earpiece 1200 may also include a microphone 1216 coupled to the processor 1202 to receive an audio input. The wireless earpiece 1200 may also include various environment sensors or a sensor pack that may include sensors, such as a temperature sensor 1217, an accelerometer 1218, and a gyroscope 1219 coupled to the processor 1202.

The processors 1002, 1111, and 1202 may be any programmable microprocessor, microcomputer or multiple processor chip or chips that can be configured by software instructions (applications) to perform a variety of functions, including the functions of the various embodiments described above. In some devices, multiple processors may be provided, such as one processor dedicated to wireless communication functions and one processor dedicated to running other applications. Typically, software applications may be stored in the internal memory 1004, 1010, 1112, 1113, 1204, and 1206 before they are accessed and loaded into the processors 1002, 1111, and 1202. The processors 1002, 1111, and 1202 may include internal memory sufficient to store the application software instructions. In many devices the internal memory may be a volatile or nonvolatile memory, such as flash memory, or a mixture of both. For the purposes of this description, a general reference to memory refers to memory accessible by the processors 1002, 1111, and 1202 including internal memory or removable memory plugged into the device and memory within the processor 1002, 1111, and 1202 themselves.

While many of the embodiments are described as being implemented using wireless devices, the claims are not limited to wireless devices unless specifically recited because the embodiments may also be implemented with wired devices. Such wired embodiments would reduce the need for separate power sources for each wireless device as well as the need to ensure that the various devices are wirelessly paired. For example, one or both wireless earpieces may be replaced by wired earpieces to decrease the need for batteries in the earpieces and decrease the likelihood that one of the earpieces may be misplaced.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored on or transmitted over as one or more instructions or code on a computer-readable medium. The steps of a method or algorithm disclosed herein may be embodied in a processor-executable software module that may reside on a tangible, non-transitory computer-readable storage medium. Tangible, non-transitory computer-readable storage media may be any available media that may be accessed by a computer. By way of example, and not limitation, such non-transitory computer-readable media may comprise RAM, ROM, EEPROM, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of non-transitory computer-readable media. Additionally, the operations of a method or algorithm may reside as one or any combination or set of codes and/or instructions on a tangible, non-transitory machine readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. An audio system comprising:
   a first wireless earpiece comprising a speaker and a microphone;
   a second wireless earpiece; and
   a mobile device comprising one or more processors configured to:
      wirelessly receive data from at least one of the microphone of the first wireless earpiece or the speaker of the first wireless earpiece;
      recognize a user gesture that includes covering at least a portion of the first wireless earpiece using at least the data received from the at least one of the microphone of the first wireless earpiece or the speaker of the first wireless earpiece; and
      in response to recognizing the user gesture that includes covering at least a portion of the first wireless earpiece using at least the data received from the at least one of the microphone of the first wireless earpiece or the speaker of the first wireless earpiece, change a volume at which the first wireless earpiece plays audio data by altering a presentation parameter of audio data played by the second wireless earpiece such that presentation parameters of audio data played by the first wireless earpiece differ from presentation parameters of audio data played by the second wireless earpiece.

2. A mobile device comprising:
   one or more processors configured with processor-executable instructions to perform operations comprising:
      wirelessly receiving data from a microphone of a first wearable device;
      recognizing a user gesture that includes covering at least a portion of the first wearable device using at least the data received from the microphone of the first wearable device; and
      in response to recognizing the user gesture that includes covering at least a portion of the first wearable device using at least the data received from the microphone of the first wearable device, changing a volume at which the first wearable device plays audio data by altering a presentation parameter of audio data played by a second wearable device such that presentation parameters of audio data played by the first wearable device differ from presentation parameters of audio data played by the second wearable device.

3. The mobile device of claim 2, wherein the first wearable device is a wireless earpiece.

4. A non-transitory processor-readable storage medium having stored thereon processor-executable instructions configured to cause a processor to perform operations comprising:
   wirelessly receiving data from a microphone of a first wearable device;
   recognizing a user gesture that includes covering at least a portion of the first wearable device using at least the data received from the microphone of the first wearable device; and
   in response to recognizing the user gesture that includes covering at least a portion of the first wearable device using at least the data received from the microphone of the first wearable device, changing a volume at which the first wearable device plays audio data by altering a presentation parameter of audio data played by a second wearable device such that presentation parameters of audio data played by the first wearable device differ from presentation parameters of audio data played by the second wearable device.

5. The non-transitory processor-readable storage medium of claim 4, wherein the first wearable device is a wireless earpiece.

6. A method comprising:
by a mobile device including one or more processors:
wirelessly receiving data from a microphone of a first wearable device;
recognizing a user gesture that includes covering at least a portion of the first wearable device using at least the data received from the microphone of the first wearable device; and
in response to recognizing the user gesture that includes covering at least a portion of the first wearable device using at least the data received from the microphone of the first wearable device, changing a volume at which the first wearable device plays audio data by altering a presentation parameter of audio data played by a second wearable device such that presentation parameters of audio data played by the first wearable device differ from presentation parameters of audio data played by the second wearable device.

7. The method of claim 6, wherein the first wearable device is a wireless earpiece.

\* \* \* \* \*